United States Patent
Tai et al.

(10) Patent No.: US 12,189,252 B2
(45) Date of Patent: Jan. 7, 2025

(54) ELECTRONIC DEVICE AND MANUFACTURING METHOD THEREOF

(71) Applicant: InnoLux Corporation, Miao-Li County (TW)

(72) Inventors: Ming-Jou Tai, Miao-Li County (TW); Chia-Hao Tsai, Miao-Li County (TW); Yi-Shiuan Cherng, Miao-Li County (TW); Wei-Yen Chiu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/512,374

(22) Filed: Nov. 17, 2023

(65) Prior Publication Data

US 2024/0210775 A1 Jun. 27, 2024

(30) Foreign Application Priority Data

Dec. 23, 2022 (CN) .......................... 202211664927.6

(51) Int. Cl.
*G02F 1/1362* (2006.01)
*G02F 1/1343* (2006.01)
*G02F 1/1368* (2006.01)
*H01L 27/12* (2006.01)

(52) U.S. Cl.
CPC .. *G02F 1/136286* (2013.01); *G02F 1/134363* (2013.01); *G02F 1/1368* (2013.01); *H01L 27/1248* (2013.01); *H01L 27/1288* (2013.01)

(58) Field of Classification Search
CPC ...................................................... G02F 1/1362
See application file for complete search history.

(56) References Cited

U.S. PATENT DOCUMENTS

| | | | |
|---|---|---|---|
| 2002/0151097 A1* | 10/2002 | Wong .................... | G02F 1/1362 438/48 |
| 2016/0259191 A1* | 9/2016 | Sun ........................ | H01L 27/12 |
| 2022/0326581 A1* | 10/2022 | Kimura ............. | G02F 1/134363 |

FOREIGN PATENT DOCUMENTS

| | | |
|---|---|---|
| CN | 205750219 U | 11/2016 |
| WO | 2021171714 A1 | 9/2021 |

* cited by examiner

*Primary Examiner* — Sang V Nguyen
(74) *Attorney, Agent, or Firm* — McClure, Qualey & Rodack, LLP

(57) ABSTRACT

An electronic device is provided. The electronic device includes a substrate, a thin-film transistor, a transparent conductive layer, a first organic layer, and a second organic layer. The thin-film transistor is disposed on the substrate and includes a drain electrode. The transparent conductive layer is disposed on the drain electrode and is electrically connected to the drain electrode. The first organic layer is disposed between the drain electrode and the transparent conductive layer. The first organic layer has a through-hole. The second organic layer is disposed in the through-hole. The electronic device has a cell gap. There is a first distance between an upper surface of the first organic layer and an upper surface of the second organic layer. The cell gap and the first distance conform to the following formula: 0<the first distance≤0.8×the cell gap.

20 Claims, 12 Drawing Sheets

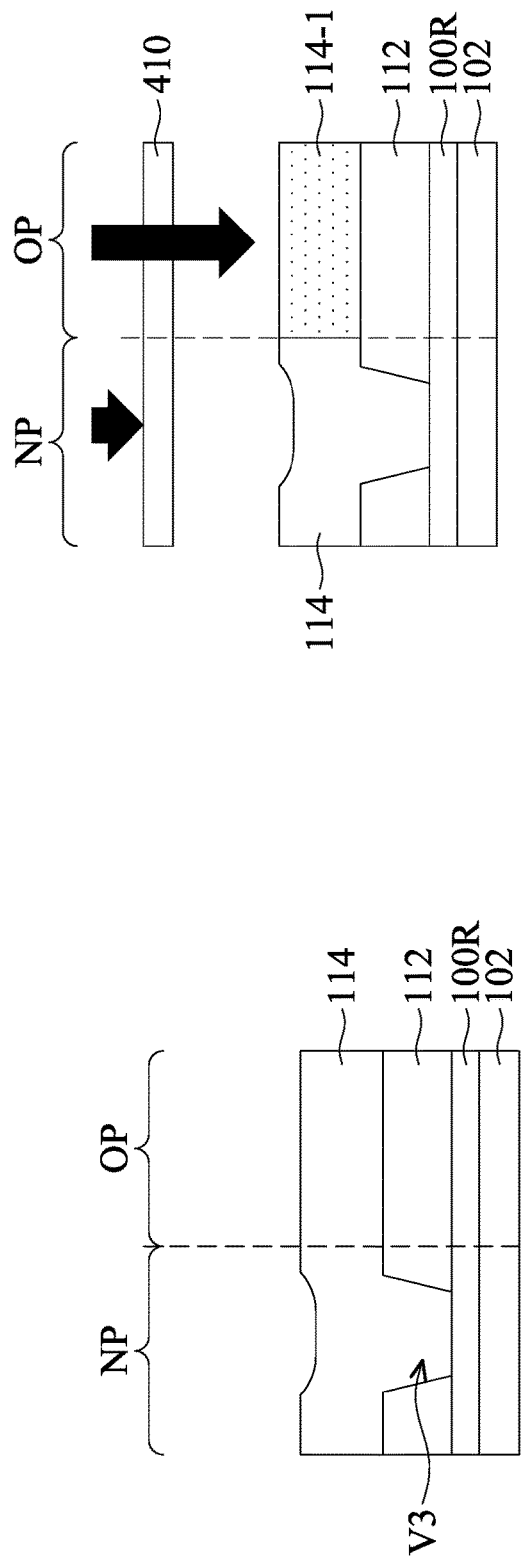
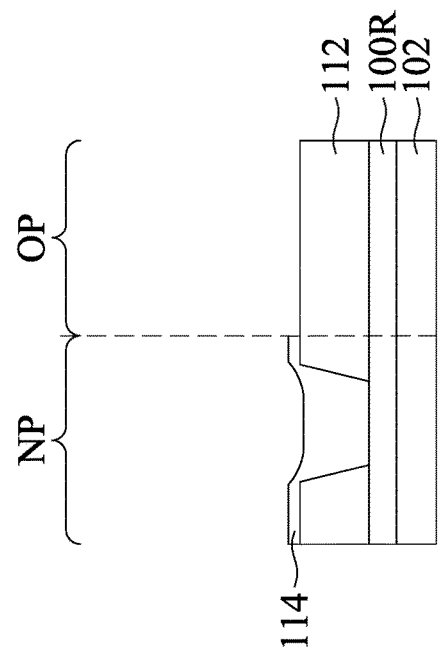
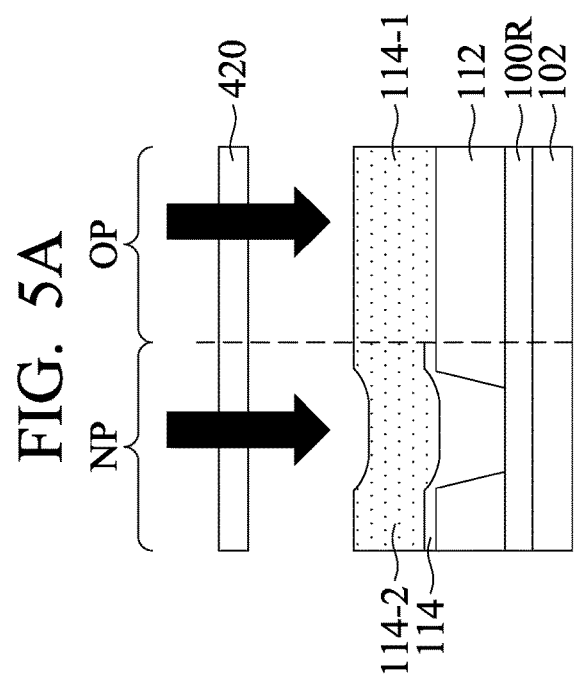
FIG. 5A
FIG. 5B
FIG. 5C
FIG. 5D

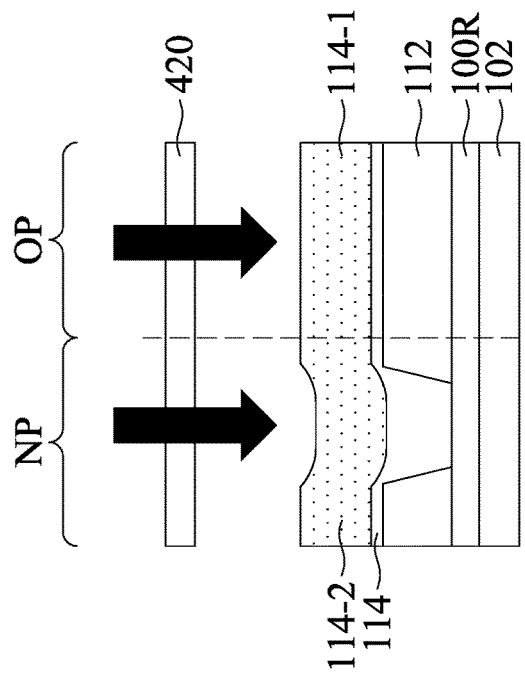
FIG. 6A
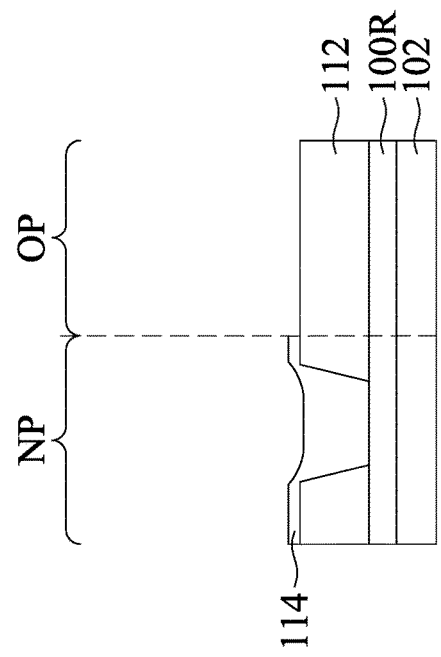
FIG. 6B
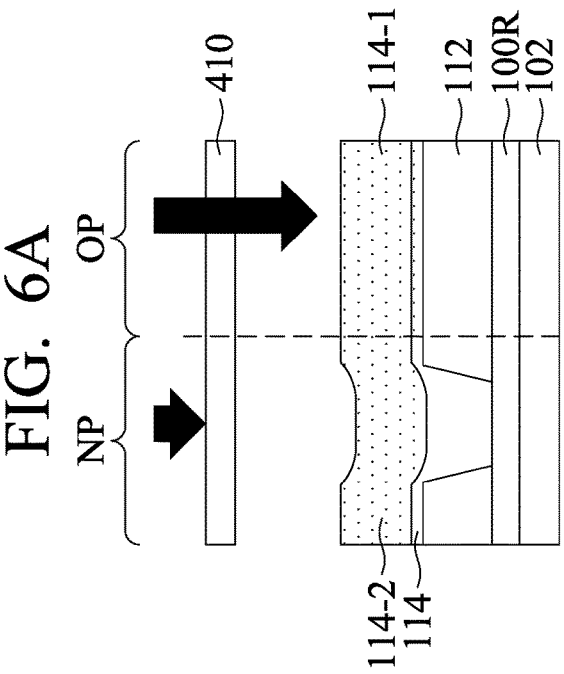
FIG. 6C
FIG. 6D

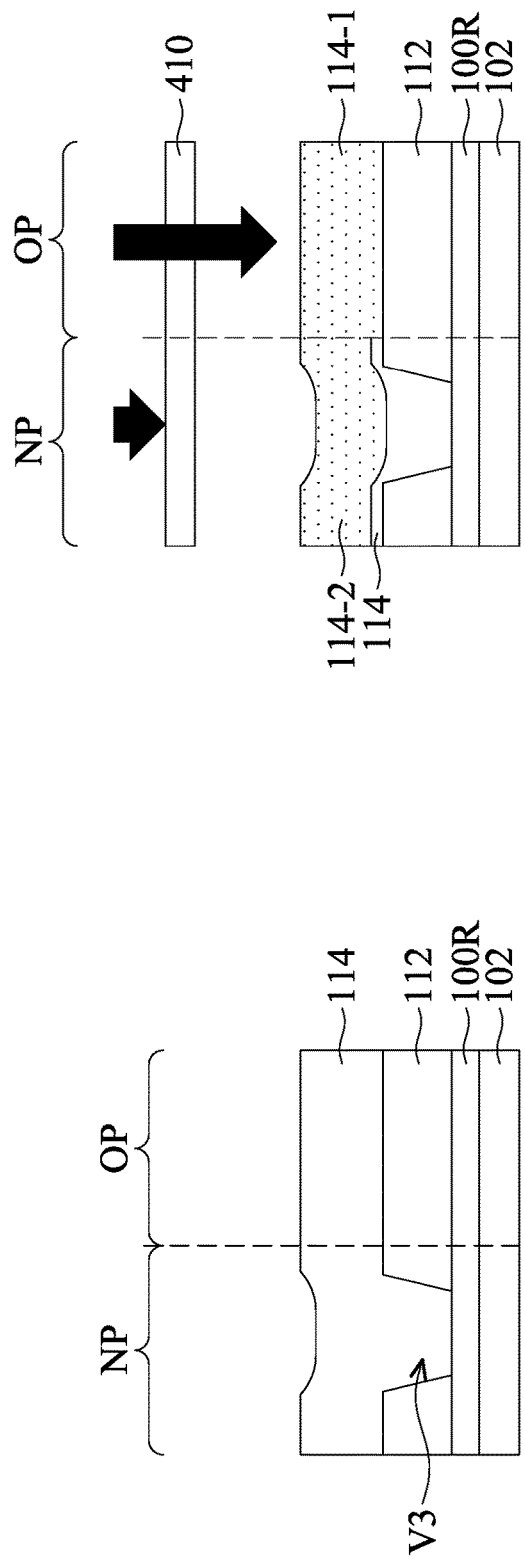
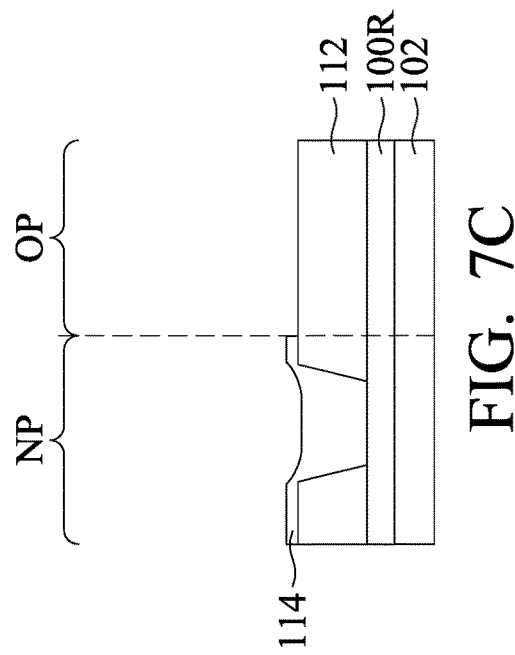
FIG. 7A
FIG. 7B
FIG. 7C

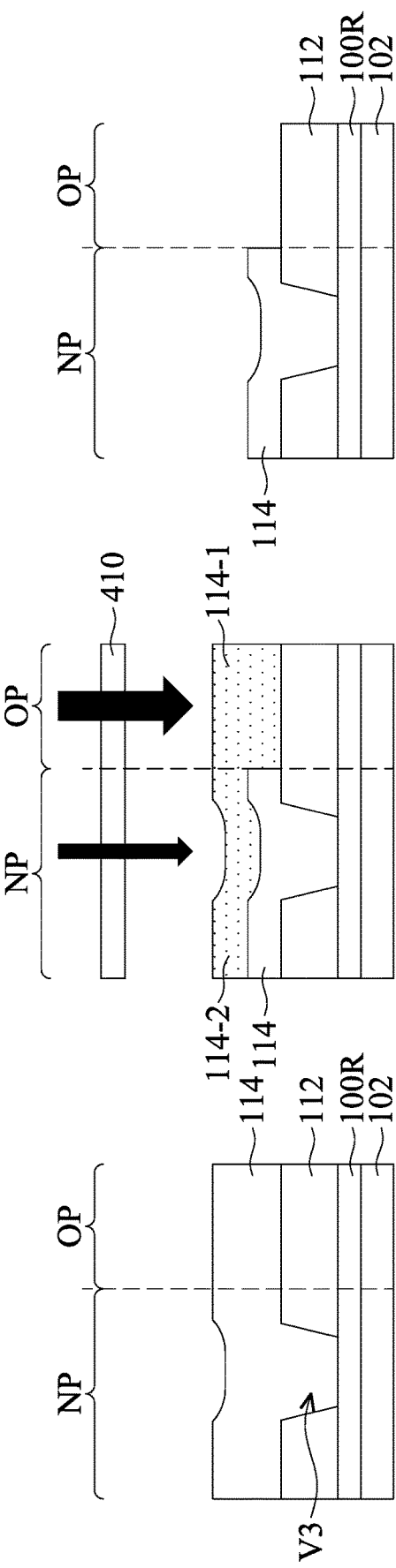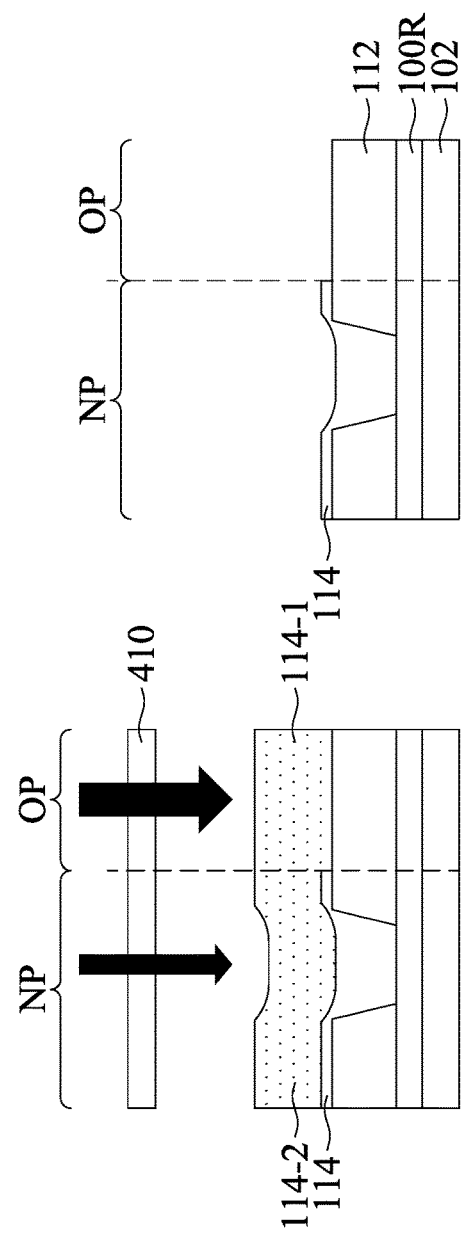

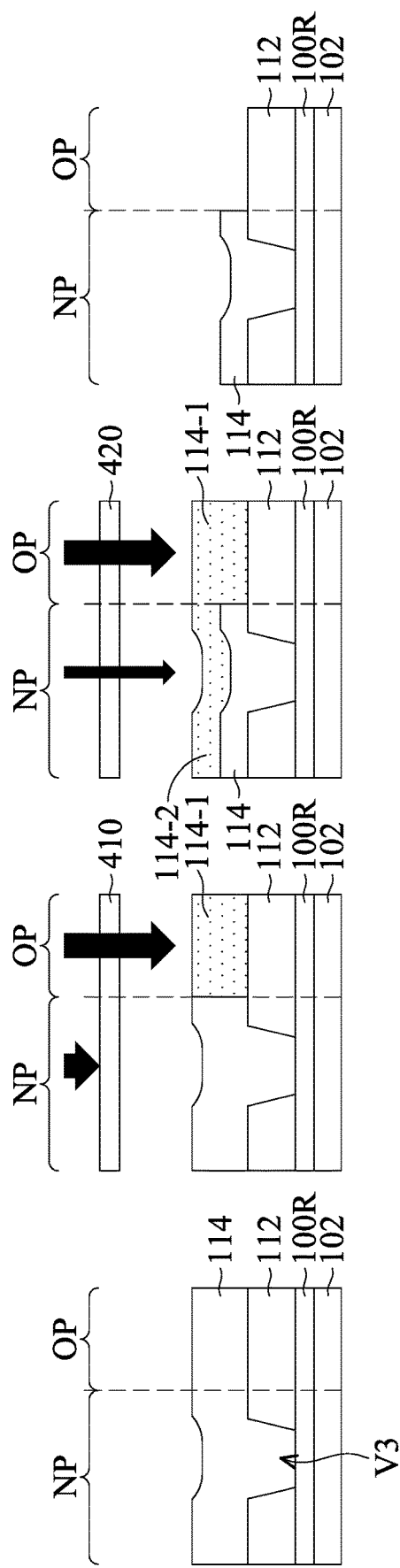
FIG. 9A
FIG. 9B
FIG. 9C
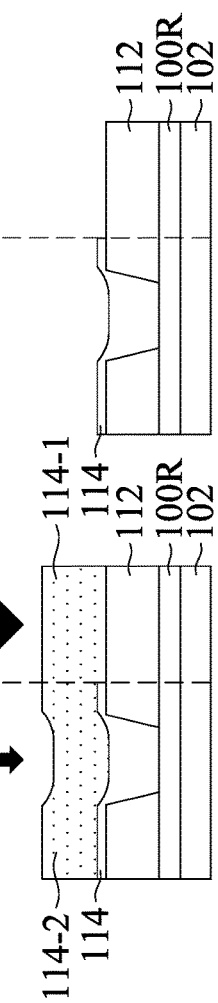
FIG. 9D
FIG. 9E
FIG. 9F

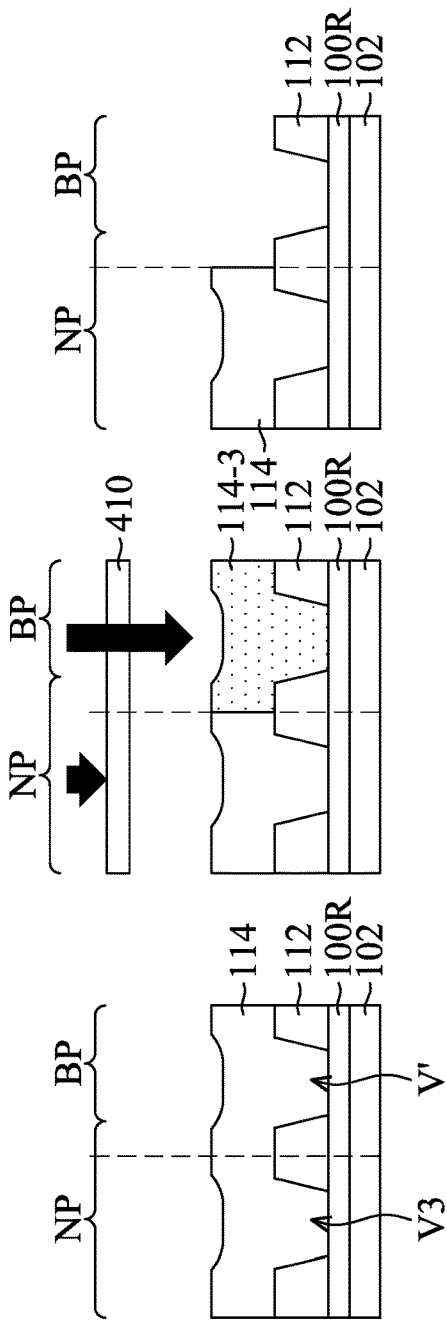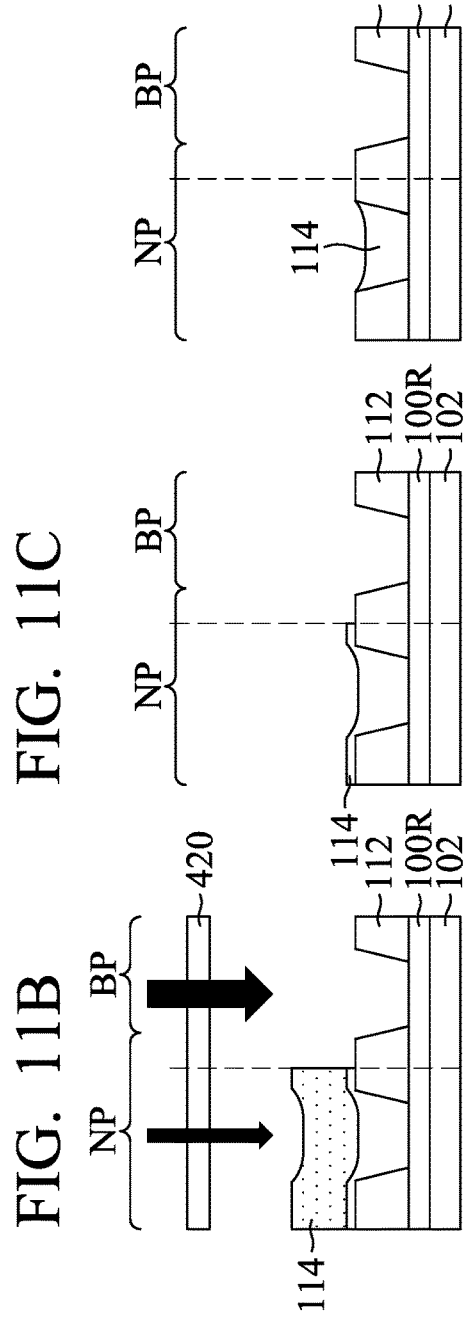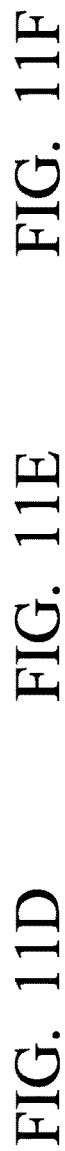

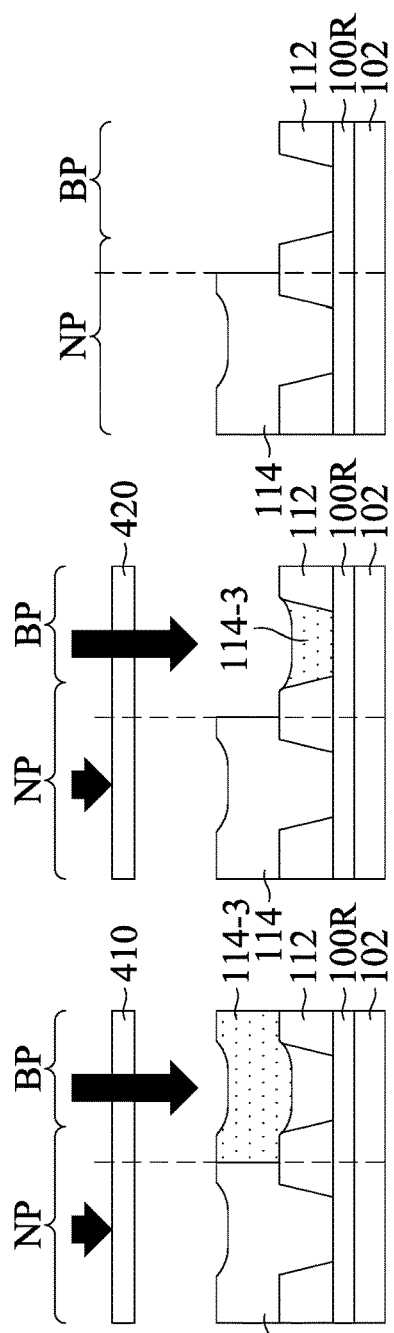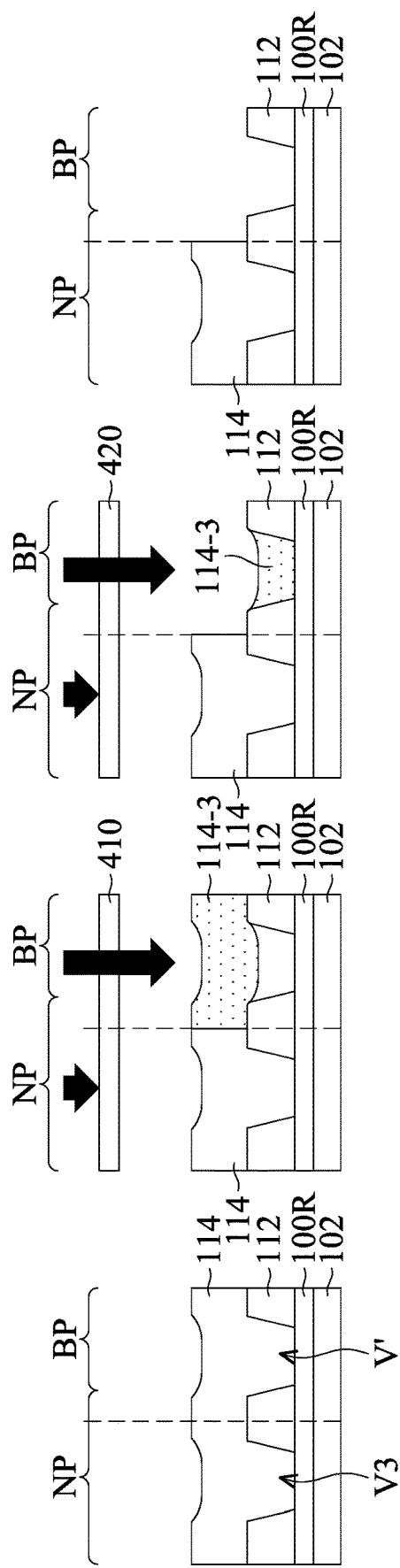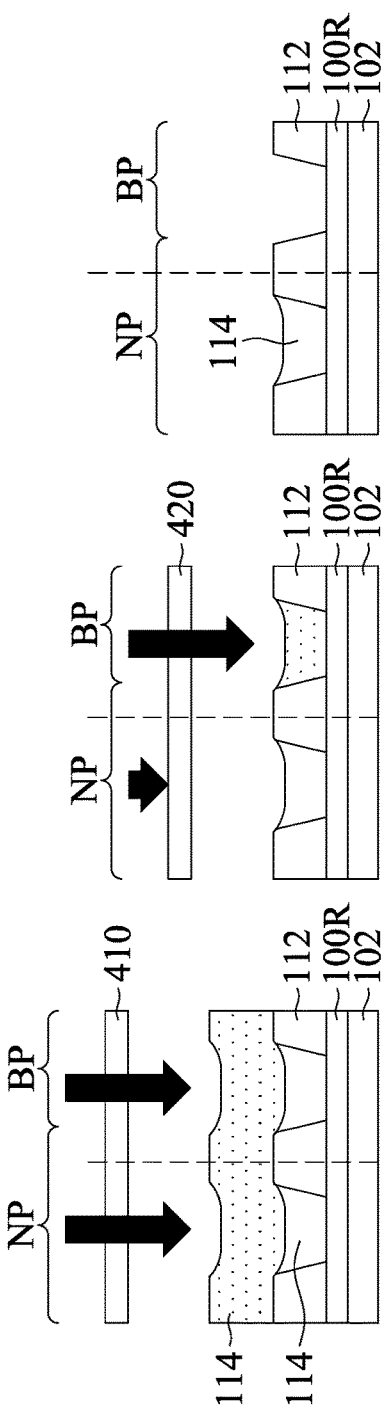
FIG. 12A  FIG. 12B  FIG. 12C  FIG. 12D
FIG. 12E  FIG. 12F  FIG. 12G

ELECTRONIC DEVICE AND MANUFACTURING METHOD THEREOF

CROSS REFERENCE TO RELATED APPLICATIONS

This application claims the benefit of China Application No. 202211664927.6, filed Dec. 23, 2022, the entirety of which is incorporated by reference herein.

BACKGROUND

Technical Field

The present disclosure is related to an electronic device and a manufacturing method thereof.

Description of the Related Art

Electronic products that are equipped with display panels, including tablet computers, notebook computers, smartphones, displays and televisions, have become an indispensable necessity in modern society. With the rapid development of these consumer electronics, consumers have high expectations regarding their quality, functionality, or price.

However, existing electronic devices still do not meet the high expectations placed upon them in all respects. For example, as the resolution increases and the pixel area decreases, how to increase the aperture ratio of a pixel and improve the process yield is still one of the current research topics in the industry.

SUMMARY

In accordance with some embodiments of the present disclosure, an electronic device is provided. The electronic device includes a substrate, a thin-film transistor, a transparent conductive layer, a first organic layer, and a second organic layer. The thin-film transistor is disposed on the substrate and includes a drain electrode. The transparent conductive layer is disposed on the drain electrode and is electrically connected to the drain electrode. The first organic layer is disposed between the drain electrode and the transparent conductive layer. The first organic layer has a through-hole. The second organic layer is disposed in the through-hole. The electronic device has a cell gap. There is a first distance between an upper surface of the first organic layer and an upper surface of the second organic layer. The cell gap and the first distance conform to the following formula: 0<the first distance≤0.8×the cell gap.

In accordance with some embodiments of the present disclosure, a method of manufacturing an electronic device is provided. The method includes providing a substrate, and forming a thin-film transistor on the substrate. The thin-film transistor includes a drain electrode. The method includes forming a first organic layer on the drain electrode, and forming a through-hole in the first organic layer. The method includes forming a transparent conductive layer on the first organic layer. At least a portion of the transparent conductive layer is filled into the through-hole, and the transparent conductive layer is electrically connected to the drain electrode. The method includes forming a second organic layer on the transparent conductive layer. The second organic layer is filled into the through-hole. Furthermore, the electronic device has a cell gap. There is a first distance between an upper surface of the first organic layer and an upper surface of the second organic layer. The cell gap and the first distance conform to the following formula: 0<the first distance≤0.8×the cell gap.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 5A to FIG. 5D are partial cross-sectional diagrams of an electronic device during the intermediate stages of the manufacturing process in accordance with some embodiments of the present disclosure;

FIG. 6A to FIG. 6D are partial cross-sectional diagrams of an electronic device during the intermediate stages of the manufacturing process in accordance with some embodiments of the present disclosure;

FIG. 7A to FIG. 7C are partial cross-sectional diagrams of an electronic device during the intermediate stages of the manufacturing process in accordance with some embodiments of the present disclosure;

FIG. 8A to FIG. 8E are partial cross-sectional diagrams of an electronic device during the intermediate stages of the manufacturing process in accordance with some embodiments of the present disclosure;

FIG. 9A to FIG. 9F are partial cross-sectional diagrams of an electronic device during the intermediate stages of the manufacturing process in accordance with some embodiments of the present disclosure;

FIG. 11A to FIG. 11F are partial cross-sectional diagrams of an electronic device during the intermediate stages of the manufacturing process in accordance with some embodiments of the present disclosure;

FIG. 12A to FIG. 12G are partial cross-sectional diagrams of an electronic device during the intermediate stages of the manufacturing process in accordance with some embodiments of the present disclosure.

DETAILED DESCRIPTION

Figure 1:
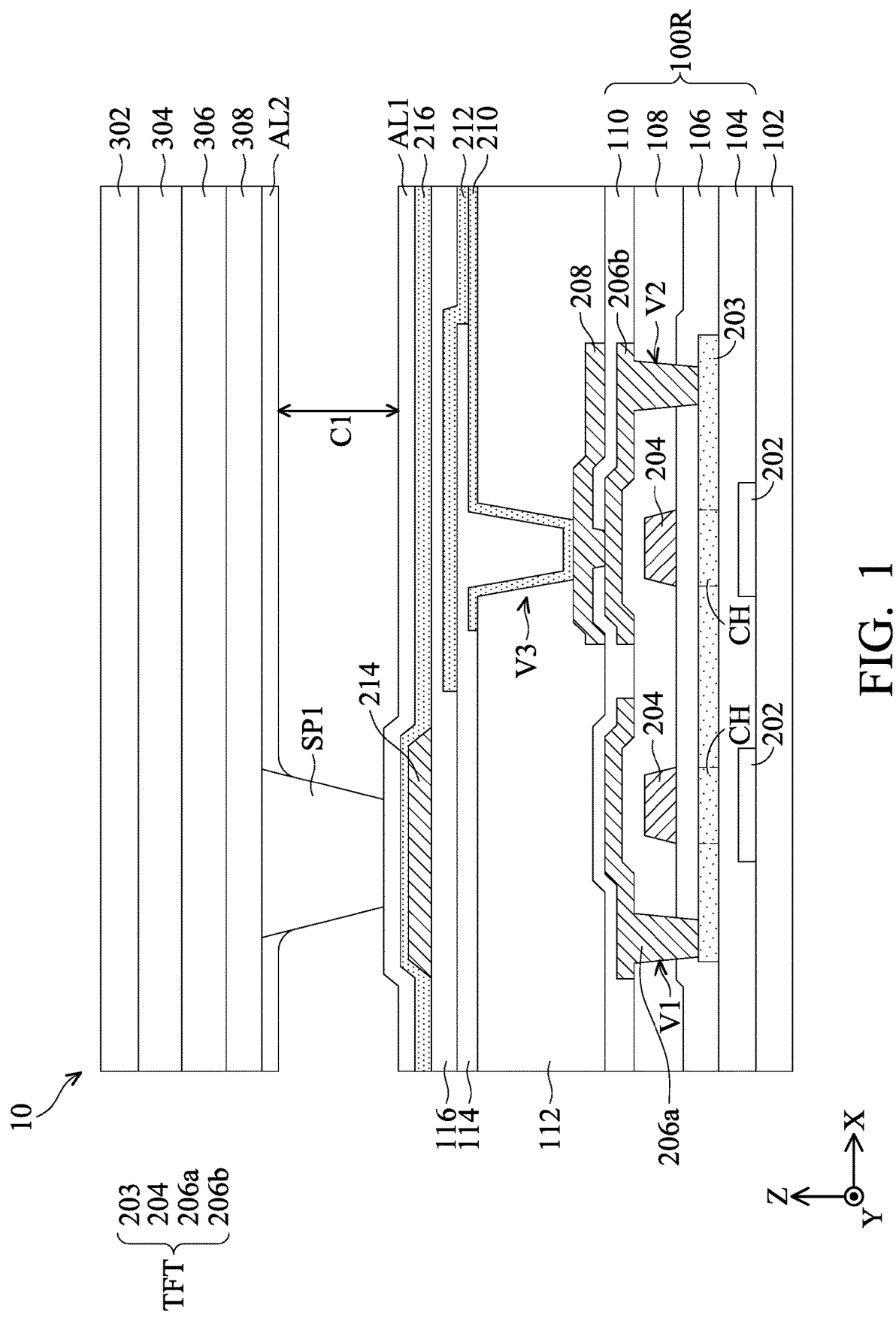
FIG. 1 is a cross-sectional diagram of an electronic device in accordance with some embodiments of the present disclosure.

The electronic device and the method of manufacturing the same according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "coupled to" may include any direct or indirect electrical connection means.

In the following descriptions, terms "about", "substantially" and "approximately" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between. Moreover, certain errors may exist between any two values or directions used for comparison. If the first value is equal to the second value, it implies that there may be an error of about 10% between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, an electronic device is provided. The electronic device includes a first organic layer having a through-hole disposed between the drain electrode and the transparent conductive layer, and a second organic layer disposed in the through-hole. The first organic layer and the second organic layer are configured in a specific manner, thereby improving the performance of the electronic device without affecting the pixel aperture ratio, for example, improving the display quality such as contrast or transmittance. In addition, in accordance with the embodiments of the present disclosure, a method of manufacturing an electronic device is also provided, which can improve the process yield and enhance the reliability of the electronic device.

In accordance with the embodiments of the present disclosure, the electronic device may include a display device, an antenna device, a light-emitting device, a sensing device, a tiled device, a touch electronic device, a curved electronic device or a non-rectangular electronic device, but it is not limited thereto. The electronic device may, for example, include liquid crystal, light-emitting diode, quantum dot (QD), fluorescence, phosphor, other suitable display media, or a combination thereof, but it is not limited thereto. The display device may be a non-self-luminous display device or a self-luminous display device. The electronic device may include passive components and active components, such as capacitors, resistors, inductors, diodes, transistors, and the like. The diode may include a light-emitting diode (LED) or a photodiode. The light-emitting diode may include an organic light-emitting diode (OLED), a mini light-emitting diode (mini LED), a micro light-emitting diode (micro LED) or a quantum dot light-emitting diode (quantum dot LED), but it is not limited thereto. The antenna device may be a liquid-crystal type antenna device or a non-liquid crystal type antenna device. The sensing device may be a sensing device for sensing capacitance, light, thermal energy or ultrasonic waves, but it is not limited thereto. The tiled device may be, for example, a display tiled device or an antenna tiled device, but it is not limited thereto. It should be noted that the electronic device can be any permutation and combination of the foregoing, but it is not limited thereto. In addition, the electronic device may be a bendable or flexible electronic device. In addition, the shape of the electronic device may be rectangular, circular, polygonal, with curved edges, or other suitable shapes. The electronic device may have peripheral systems such as a driving system, a control system, a light source system, etc. to support a display device, an antenna device, a wearable device (e.g., including an augmented reality (AR) device or a virtual reality (VR) device), a vehicle-mounted device (e.g., including car windshields), or a tiled device. For the convenience of description, the electronic device will be described below as a display device, but the present disclosure is not limited thereto.

Please refer to FIG. 1, which is a cross-sectional diagram of an electronic device 10 in accordance with some embodiments of the present disclosure. It should be understood that, for clarity, some elements of the electronic device 10 may be omitted in the drawings, and only some elements are schematically shown. In accordance with some embodiments, additional features may be added to the electronic device 10 described below.

As shown in FIG. 1, the electronic device 10 may include a substrate 102 and a structural layer 100R. The structural layer 100R may be disposed on the substrate 102. In accordance with some embodiments, the substrate 102 may be used as a driving substrate, the structural layer 100R may include a driving circuit (not illustrated), and the driving circuit may include an active driving circuit or a passive driving circuit. In accordance with some embodiments, the structural layer 100R may include a plurality of data lines (not illustrated) and a plurality of scan lines (not illustrated), and the data lines and the scan lines are interlaced to define a plurality of pixels units. These pixel units may be respectively provided with thin-film transistors TFT. In accordance with some embodiments, the thin-film transistor TFT may include a switching transistor, a driving transistor, a reset transistor, or another thin-film transistor, but it is not limited thereto. It should be understood that although the thin-film transistor TFT shown in the drawings has a top gate thin-film transistor structure, the thin-film transistor TFT may also have a bottom gate thin-film transistor structure or a dual gate (or double gate) thin-film transistor structure in accordance with some other embodiments. For example, in accordance with some embodiments, the light-shielding layer 202 can be used as a lower gate, forming a dual gate (or double gate) thin-film transistor structure with the top gate thin-film transistor TFT.

Specifically, in accordance with some embodiments, the structural layer 100R may include a semiconductor layer 203, a gate electrode 204, a source electrode 206a, and a drain electrode 206b, serving as a thin-film transistor TFT. In accordance with some embodiments, the structural layer 100R may further include an insulating layer 104, an insulating layer 106, an insulating layer 108, and an insulating layer 110 sequentially disposed on the substrate 102. The semiconductor layer 203 may be disposed on the insulating layer 104. The gate electrode 204 may be disposed on the insulating layer 106 and the semiconductor layer 203. The insulating layer 106 may be disposed between the semiconductor layer 203 and the gate electrode 204. Furthermore, in accordance with some embodiments, the structural layer 100R may optionally include a conductive element 208 disposed on the insulating layer 110, and the conductive element 208 may be disposed between the drain electrode 206b and the transparent conductive layer 210.

In accordance with some embodiments, the semiconductor layer 203 may include a doped region (not illustrated) including a suitable dopant and a channel region CH. For example, the channel region CH may be disposed between two doped regions with different conductivity properties (such as p-type and n-type). The gate electrode 204 may overlap the semiconductor layer 203 in a normal direction of the substrate 102 (e.g., the Z direction in the drawing). The overlapping area of the semiconductor layer 203 and the gate electrode 204 can be regarded as the channel region CH. The source electrode 206a and the drain electrode 206b may be electrically connected to the doped regions on both sides of the semiconductor layer 203 respectively, and the doped regions can serve as a source contact and a drain contact respectively. In accordance with some embodiments, the drain electrode 206b may at least partially overlap the gate electrode 204 in the normal direction of the substrate 102 (e.g., the Z direction in the drawing). Furthermore, the source electrode 206a may be electrically connected to the source contact of the semiconductor layer 203 through a through-hole V1 penetrating the insulating layer 106 and the insulating layer 108, and the drain electrode 206b may be electrically connected to the drain contact of the semiconductor layer 203 through a through-hole V2 penetrating the insulating layer 106 and the insulating layer 108. In accordance with some embodiments, the source electrode 206a may be electrically connected to the data line, the drain electrode 206b may be electrically connected to the transparent conductive layer 210, and the gate electrode 204 may be electrically connected to the scan line. In accordance with some embodiments, the source electrode 206a may be, for example, a part of the data line, and the gate electrode 204 may be, for example, a part of the scan line. In accordance with some embodiments, the conductive element 208 is electrically connected to the drain electrode 206b and the transparent conductive layer 210, and the conductive element 208 has a large area to increase the amount of electron transmission, which can stabilize the electron transmission between the transparent conductive layer 210 and the drain electrode 206b, or reduce the resistance between them, thereby improving the display quality.

In addition, in accordance with some embodiments, the electronic device 10 may further include a light-shielding layer 202. The light-shielding layer 202 may be disposed between the substrate 102 and the thin-film transistor TFT, and the light-shielding layer 202 may at least partially overlap a through-hole V3 in the normal direction of the substrate 102. In accordance with some embodiments, the light-shielding layer 202 can shield light leakage from the through-hole V3. In some embodiments, the light-shielding layer 202 may be electrically connected to the gate electrode 204, but the present disclosure is not limited thereto.

The substrate 102 may include a flexible substrate, a rigid substrate, or a combination thereof, but it is not limited thereto. In accordance with some embodiments, the material of the substrate 102 may include glass, quartz, sapphire, ceramic, polyimide (PI), polycarbonate (PC), polyethylene terephthalate (PET), polypropylene (PP), another suitable material or a combination thereof, but it is not limited thereto. Moreover, in accordance with some embodiments, the substrate 102 may include a metal-glass fiber composite board or a metal-ceramic composite board, but it is not limited thereto. In addition, the transmittance of the substrate 102 is not limited. That is, the substrate 102 may be a transparent substrate, a semi-transparent substrate or an opaque substrate.

In accordance with some embodiments, the material of the light-shielding layer 202 may include a metal material, such as copper (Cu), aluminum (Al), molybdenum (Mo), tungsten (W), gold (Au), silver (Ag), tin (Sn), chromium (Cr), nickel (Ni), platinum (Pt), titanium (Ti), iridium (Ir), rhodium (Rh), alloys of the aforementioned metals, another suitable conductive material, or a combination thereof, but it is not limited thereto. In accordance with some embodiments, the light-shielding layer 202 may be formed by a chemical vapor deposition (CVD) process, a spin coating process, a physical vapor deposition (PVD) process, an electroplating process, an electroless plating process, another suitable method, or a combination thereof. Moreover, the light-shielding layer 202 may be patterned by one or more photolithography processes and/or etching processes.

In accordance with some embodiments, the material of the semiconductor layer 203 may include metal oxide, amorphous silicon or polysilicon (for example, low-temp polysilicon (LTPS)), or a combination thereof, but it is not limited thereto. In accordance with some embodiments, the semiconductor layer 203 may be formed by a chemical vapor deposition (CVD) process, another suitable method, or a combination thereof. The chemical vapor deposition process may include, for example, a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, etc., but it is not limited thereto. Moreover, the semiconductor layer 203 may be patterned by one or more photolithography processes and/or etching processes. In accordance with some embodiments, the photolithography process may include photoresist coating (such as spin coating), soft baking, hard baking, mask alignment, exposure, post-exposure baking, photoresist development, cleaning and drying, etc., but it is not limited thereto. The etching process may include a dry etching process or a wet etching process, but it is not limited thereto.

In accordance with some embodiments, the material of the gate electrode 204 may include a conductive material, such as copper (Cu), silver (Ag), gold (Au), tin (Sn), aluminum (Al), molybdenum (Mo), tungsten (W), chromium (Cr), nickel (Ni), platinum (Pt), titanium (Ti), palladium (Pd), alloys of the aforementioned metals, another suitable conductive material or a combination thereof, but it is not limited thereto. In accordance with some embodiments, the gate electrode 204 may be formed by a physical vapor deposition (PVD) process, an electroplating process, an electroless plating process, another suitable method, or a combination thereof. Also, the gate electrode 204 may be patterned by one or more photolithography processes and/or etching processes.

The source electrode 206a and the drain electrode 206b may include a conductive material, such as a metal material, a transparent conductive material or another suitable conductive material. In accordance with some embodiments, the aforementioned metal material may be the same as or similar to the material of the gate electrode 204, which will not be repeated here. In accordance with some embodiments, the aforementioned transparent conductive material may include transparent conductive oxide (TCO), for example, may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto. In accordance with some embodiments, the source electrode 206a and the drain electrode 206b may be formed by a chemical vapor deposition process, a spin coating process, a physical vapor deposition process, an electroplating process, an electroless plating process, another suitable method, or a combination thereof. Furthermore, the source electrode 206a and the drain electrode 206b may be patterned by one or more photolithography processes and/or etching processes.

Moreover, in accordance with some embodiments, the material of the insulating layer 104 may include an organic material, an inorganic material or a combination thereof. The organic material may include, for example, polyethylene terephthalate (PET), polyethylene (PE), polyethersulfone (PES), polycarbonate (PC), polymethylmethacrylate (PMMA), isoprene, phenol-formaldehyde resin, benzocyclobutene (BCB), perfluorocyclobutane (PECB), another suitable buffer material or a combination thereof, but it is not limited thereto. The inorganic material may include, for example, silicon nitride, silicon oxide, silicon oxynitride, another suitable buffer material, or a combination thereof, but is not limited thereto. In accordance with some embodiments, the insulating layer 104 may have a single-layer or multi-layer structure.

In accordance with some embodiments, the material of the insulating layer 106 may include silicon oxide, silicon nitride, silicon oxynitride, a high-k dielectric material, another suitable dielectric material, or a combination thereof, but it is not limited thereto. The aforementioned high-k dielectric material may include metal oxide, metal nitride, metal silicide, transition metal oxide, transition metal nitride, transition metal silicide, metal oxynitride, metal aluminum salt, zirconate, zircoaluminate, another suitable material, or a combination thereof, but it is not limited thereto. In accordance with some embodiments, the insulating layer 106 may have a single-layer or multi-layer structure.

In accordance with some embodiments, the material of the insulating layer 108 may include a polymer material, for example, may include polybenzoxazole (PBO), polyimide, benzocyclobutene (BCB), another suitable polymer material or a combination thereof, but it is not limited thereto. In accordance with some other embodiments, the insulating layer 108 may include silicon nitride, silicon oxide, silicon oxynitride, phosphosilicate glass (PSG), borosilicate glass (BSG), boron-doped phosphosilicate glass (BPSG), another suitable material, or a combination thereof, but it is not limited thereto. Furthermore, the insulating layer 108 may have a single-layer or multi-layer structure.

Moreover, the material of the insulating layer 110 may include an inorganic material or an organic material. In accordance with some embodiments, the inorganic material may include, for example, silicon nitride, silicon oxide, silicon oxynitride, aluminum oxide, another suitable material, or a combination thereof, but it is not limited thereto. In accordance with some embodiments, the organic material may include, for example, perfluoroalkoxy alkane (PFA), polytetrafluoroethylene (PTFE), fluorinated ethylene propylene (FEP), polyethylene, another suitable material, or a combination thereof, but it is not limited thereto. Furthermore, the insulating layer 110 may have a single-layer or multi-layer structure.

The material and manufacturing method of the conductive element 208 may be the same as or similar to that of the light-shielding layer 202, and thus will not be repeated here.

Please refer to FIG. 1. The electronic device 10 may include a first organic layer 112, a transparent conductive layer 210 and a second organic layer 114. The first organic layer 112 may be disposed on the insulating layer 110. The transparent conductive layer 210 may be disposed on the first organic layer 112. The transparent conductive layer 210 may be disposed on the drain electrode 206b. In other words, the first organic layer 112 may be disposed between the drain electrode 206b and the transparent conductive layer 210. The first organic layer 112 has a through-hole V3. The transparent conductive layer 210 may be disposed on the first organic layer 112 and extended in the through-hole V3, and the transparent conductive layer 210 may be electrically connected to the drain electrode 206b through the through-hole V3. Moreover, the second organic layer 114 may be disposed on the first organic layer 112 and the transparent conductive layer 210, and the second organic layer 114 may be extended and disposed in the through-hole V3.

In addition, the through-hole V3 may at least partially overlap the gate electrode 204 in the normal direction of the substrate 102 (e.g., the Z direction in the drawing). In accordance with some embodiments, the transparent conductive layer 210 may at least partially overlap the gate electrode 204 in the normal direction of the substrate 102. It should be noted that the transparent conductive layer 210 is electrically connected to the drain electrode 206b through the through-hole V3 of the first organic layer 112, and the through-hole V3 is disposed above the gate electrode 204, so the gate electrode 204 can be used to shield light. The light leakage of the through-hole V3 can be reduced or the contrast ratio can be increased, thereby increasing the aperture ratio of the pixel.

In accordance with some embodiments, the first organic layer 112 and the second organic layer 114 may serve as planarization layers. In accordance with some embodiments, the material of the first organic layer 112 and the second organic layer 114 may include a photoresist material, for example, may include epoxy resin, acrylic resin (such as polymethylmetacrylate (PMMA)), benzocyclobutene (BCB), polyimide, perfluoroalkoxyalkane (PFA), another suitable material, or a combination thereof, but it is not limited thereto. The material of the first organic layer 112 may be the same as or different from the material of the second organic layer 114. In accordance with some embodiments, the first organic layer 112 and the second organic layer 114 may be formed by a coating process, a printing process, another suitable process, or a combination thereof. Moreover, a portion of the first organic layer 112 may be removed by one or more photolithography processes and/or etching processes to form the through-hole V3.

It should be noted that the second organic layer 114 disposed above the first organic layer 112 and filled in the through-hole V3 can reduce the uneven topography caused by the through-hole V3. Therefore, display problems such as light leakage due to poor alignment of the display medium (e.g., liquid crystals) or decreased contrast can be reduced. Furthermore, it can reduce the damage or fracture of the transparent conductive layer 210, the transparent conductive layer 212 and/or the insulating layer 116 due to uneven topography, thereby reducing the occurrence of short circuit or open circuit. In accordance with some embodiments, the second organic layer 114 may also serve as a spacing element supporting a cell gap of the electronic device 10 or provide a flat area for the spacing element. The detailed structure and manufacturing process of the first organic layer 112 and the second organic layer 114 will be further described below.

In accordance with some embodiments, the material of the transparent conductive layer 210 and the transparent conductive layer 212 may include a transparent conductive oxide (TCO), such as indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material or a combination thereof, but it is not limited thereto. In accordance with some embodiments, the transparent conductive layer 210 and the transparent conductive layer 212 may be formed by a chemical vapor deposition process, a spin coating process, another suitable method, or a combination thereof. Moreover, the transparent conductive layer 210 and the transparent conductive layer 212 may be patterned by one or more photolithography processes and/or etching processes.

In addition, in accordance with some embodiments, the electronic device 10 may further include a transparent conductive layer 212, an insulating layer 116, a conductive layer 214, a transparent conductive layer 216, and an alignment layer AL1. The transparent conductive layer 212 may be disposed on the second organic layer 114 and the transparent conductive layer 210. The insulating layer 116 may be disposed on the transparent conductive layer 212. The conductive layer 214 may be disposed on the insulating layer 116. The transparent conductive layer 216 may be disposed on the insulating layer 116 and cover the conductive layer 214. In accordance with some embodiments, the transparent conductive layer 212 may at least partially overlap the transparent conductive layer 210 in the normal direction of the substrate 102 (e.g., the Z direction in the drawing). In accordance with some embodiments, the transparent conductive layer 212 may serve as a pixel electrode. In accordance with some embodiments, the transparent conductive layer 210 may be electrically connected to the transparent conductive layer 212 to increase the storage capacitance. In accordance with some embodiments, the conductive layer 214 may be electrically connected to the transparent conductive layer 216, and the transparent conductive layer 216 may serve as a common electrode, and the conductive layer 214 may be electrically connected to the transparent conductive layer 216, which can further reduce the impedance of the common electrode and improve electrical uniformity. The alignment layer AL1 may be disposed on the transparent conductive layer 216, or disposed between a first spacing element SP1 and the transparent conductive layer 216.

The material and manufacturing method of the transparent conductive layer 216 may be the same as or similar to that of the transparent conductive layer 210 and the transparent conductive layer 212 described above, and thus will not be repeated here.

The material and manufacturing method of the insulating layer 116 may be the same as or similar to that of the insulating layer 110 described above, and thus will not be repeated here.

The material and manufacturing method of the conductive layer 214 may be the same as or similar to that of the aforementioned conductive element 208, and thus will not be repeated here. In accordance with some other embodiments, the conductive layer 214 may be a conductive material with low reflectivity, such as Mo, Ti, Cr or their oxides. Furthermore, the conductive layer 214 can reduce the impedance of the transparent conductive layer 216, and/or improve the visual visibility problem caused by the reflection of the metal material, reduce the probability of light entering the TFT, or increase the aperture ratio.

In addition, in accordance with some embodiments, the electronic device 10 may further include a substrate 302, a light-shielding layer 304, a color filter layer 306, a protective layer 308, a first spacing element SP1 and an alignment layer AL2. The substrate 302 may be used as a color filter substrate and disposed opposite to the substrate 102. The light-shielding layer 304, the color filter layer 306, the protective layer 308 and the alignment layer AL2 may be sequentially disposed on the substrate 302. In accordance with some embodiments, the light-shielding layer 304 may have a plurality of openings (not illustrated), and the color filter layer 306 may overlap the openings of the light-shielding layer 304. The protective layer 308 may be disposed between the color filter layer 306 and the first spacing element SP1. The first spacing element SP1 may be disposed on the first organic layer 112 and the second organic layer 114, and disposed between the driving substrate and the color filter substrate. The alignment layer AL2 may at least partially cover the first spacing element SP1. Furthermore, in the normal direction of the substrate 102 (e.g., the Z direction in the drawing), the first spacing element SP1 may or may not overlap the through-hole V3. In accordance with some other embodiments, the color filter layer 306 may be formed on the substrate 302 first, and then the light-shielding layer 304 may be formed on the color filter layer 306. That is, the color filter layer 306 may be disposed between the substrate 302 and the light-shielding layer 304, but the present disclosure is not limited thereto.

The material of the substrate 302 may be the same as or similar to that of the aforementioned substrate 102, and thus it will not be repeated here.

In accordance with some embodiments, the material of the light-shielding layer 304 may include black photoresist, black printing ink, black resin, metal, carbon black material, resin material, photosensitive material, another suitable material, or a combination thereof, but it is not limited thereto. In accordance with some embodiments, the light-shielding layer 304 may be formed by a spin-coating process, a chemical vapor deposition process, another suitable method, or a combination thereof.

The color filter layer 306 can filter or adjust the optical properties of light passing through it, for example, allowing light in a specific wavelength range to pass through. In accordance with some embodiments, the color filter layer 306 may include a red filter unit, a green filter unit, a blue filter unit, a white filter unit or a filter unit of other colors, but it is not limited thereto. According to different embodiments, the color filter layer 306 may have any suitable number or color of color filter units. In accordance with some embodiments, the material of the color filter layer 306 may include a color photoresist, and the material of the color photoresist may include, for example, a polymer material and pigments and photosensitive materials dispersed therein.

The protective layer 308 has optical adjustment properties or protection properties (e.g., waterproof and moisture-proof). In accordance with some embodiments, the material of the protective layer 308 may include an organic material. In accordance with some embodiments, the protective layer 308 may include an adhesive material, such as optical clear adhesive (OCA), optical clear resin (OCR), pressure sensitive adhesive (PSA), acrylic glue, acrylic resin, another suitable material, or a combination thereof, but it is not limited thereto.

The cell gap C1 of the electronic device 10 is, for example, the distance between the alignment layer AL1 and the alignment layer AL2 in the normal direction Z of the substrate 102. Specifically, in the normal direction of the substrate 102 (for example, the Z direction in the drawing), the maximum distance between the opposite surfaces of the alignment layer AL1 and the alignment layer AL2 can be regarded as the cell gap C1. In accordance with some embodiments, the material of the first spacing element SP1 may include a photoresist material, but it is not limited thereto.

Figure 2:
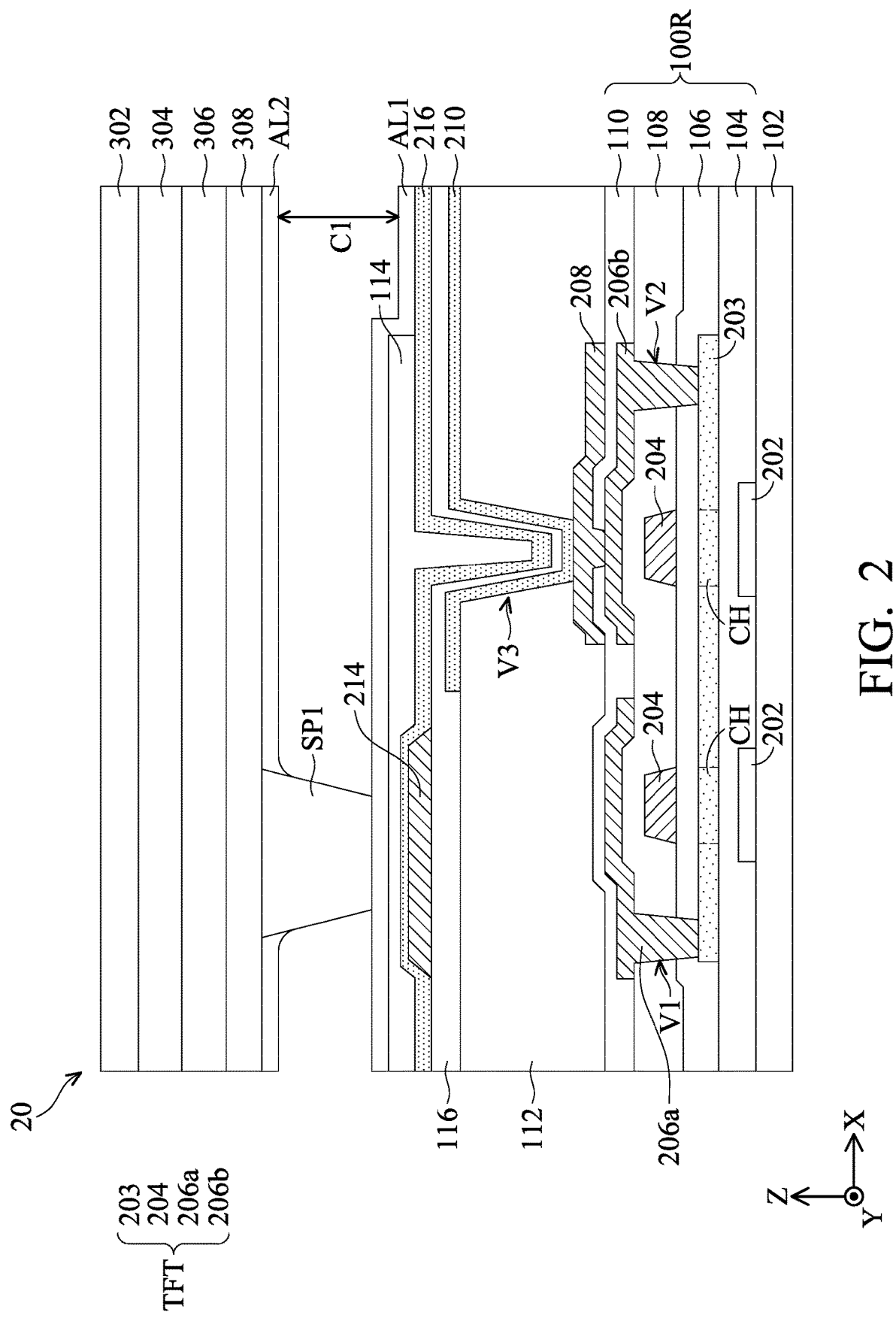
FIG. 2 is a cross-sectional diagram of an electronic device in accordance with some embodiments of the present disclosure.

Next, please refer to FIG. 2, which is a cross-sectional diagram of an electronic device 20 in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated in the following description.

As shown in FIG. 2, in this embodiment, the insulating layer 116 is disposed on the first organic layer 112, and extended in the through-hole V3 and on the transparent conductive layer 210. The transparent conductive layer 216 can also extend in the through-hole V3. Moreover, the second organic layer 114 is disposed on the transparent conductive layer 216 and filled in the through-hole V3.

Similarly, the second organic layer 114 disposed above the first organic layer 112 and filled in the through-hole V3 can reduce the uneven topography caused by the through-hole V3. Therefore, display problems such as light leakage due to poor alignment of the display medium (e.g., liquid crystals) or decreased contrast can be reduced. Moreover, the second organic layer 114 can also be used as a spacing element supporting the cell gap C1 of the electronic device 10 or provide a flat area for the spacing element (for example, the first spacing element SP1 shown in the drawing).

Figure 3A:
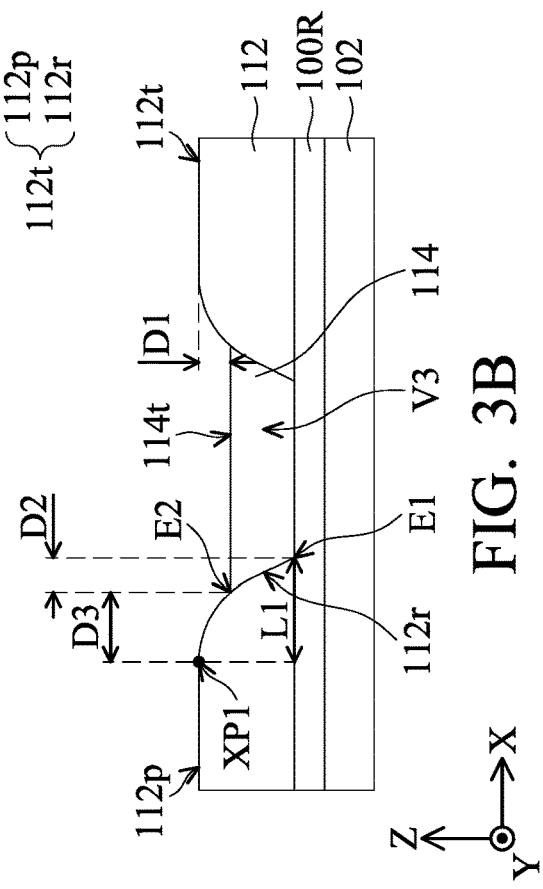
FIG. 3A to FIG. 3C are partial cross-sectional diagrams of an electronic device in accordance with some embodiments of the present disclosure.
Figure 3B:
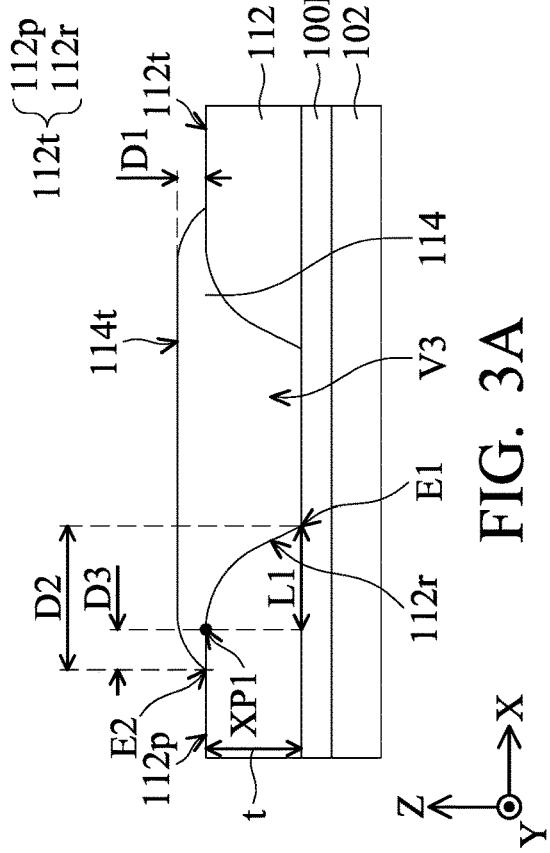
Figure 3C:
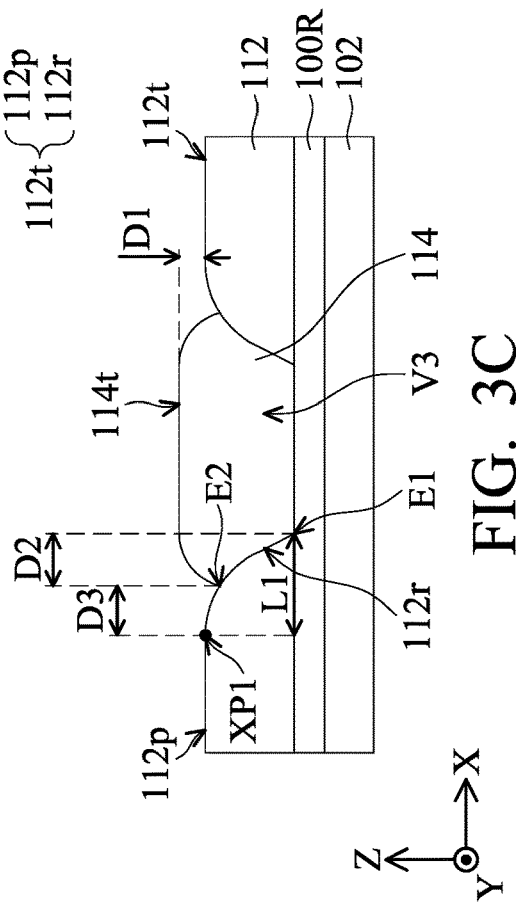

Next, please refer to FIG. 3A to FIG. 3C, which are partial cross-sectional diagrams of the electronic device (electronic device 20) in accordance with some embodiments of the present disclosure. It should be understood that, for clarity, most components of the electronic device 10 (electronic device 20) are omitted in the drawings, and only the substrate 102, the structural layer 100R, the first organic layer 112 and the second organic layer 114 are shown.

As shown in FIG. 3A to FIG. 3C, the first organic layer 112 has the through-hole V3, and the second organic layer 114 is disposed in the through-hole V3. In accordance with some embodiments, the upper surface 114t of the second organic layer 114 may be higher than the upper surface 112t of the first organic layer 112 (as shown in FIG. 3A and FIG. 3C). In accordance with some other embodiments, the upper surface 114t of the second organic layer 114 may be lower than the upper surface 112t of the first organic layer 112 (as shown in FIG. 3B). In particular, there is a first distance D1 between the upper surface 112t of the first organic layer 112 and the upper surface 114t of the second organic layer 114, and the cell gap C1 (e.g., as shown in FIG. 1 and FIG. 2) and the first distance D1 conform to the following formula: 0<the first distance≤0.8×the cell gap. That is, the first distance D1 is greater than 0 and less than or equal to 0.8 times the cell gap C1.

The aforementioned first distance D1 refers to the distance between the upper surface 112t of the first organic layer 112 and the upper surface 114t of the second organic layer 114 in the normal direction of the substrate 102 (for example, the Z direction in the drawing). Specifically, in accordance with some embodiments, the upper surface 112t of the first organic layer 112 may have a flat portion 112p and a curved portion 112r adjacent to the flat portion 112p, and the curved portion 112r may be adjacent to the through-hole V3. Furthermore, in accordance with some embodiments, the upper surface 114t of the second organic layer 114 may have a flat portion 114p (please refer to the labeling in FIG. 4A and FIG. 4B) and a curved portion 114r (please refer to the labeling in FIGS. 4A and 4B) adjacent to the flat portion 114p. The aforementioned first distance D1 refers to the distance between the flat portion 112p of the first organic layer 112 and the flat portion 114p of the second organic layer 114 in the normal direction of the substrate 102 (for example, the Z direction in the drawing).

It should be understood that, in accordance with the embodiments of the present disclosure, an optical microscope (OM), a scanning electron microscope (SEM), a film thickness profiler (α-step), an ellipsometer or another suitable method may be used to measure the distance, spacing or angle between elements, or the width or thickness of each element. Specifically, in accordance with some embodiments, a scanning electron microscope may be used to obtain a cross-sectional image including the elements to be measured, and the distance, spacing or angle between elements, or the width or thickness of each element in the image can be measured.

It should be noted that when the cell gap C1 and the first distance D1 conform to the aforementioned formula: 0<the first distance≤0.8×the cell gap, it can reduce the probability that the height of the second organic layer 114 is too high or too low to cause poor alignment of the display medium (e.g., liquid crystal), so that display problems such as light leakage or contrast drop can be improved.

Furthermore, the curved portion 112r of the first organic layer 112 has a first length L1 in the horizontal direction (e.g., a direction perpendicular to the normal direction of the substrate 102, the X direction in the drawing). The second organic layer 114 has a first edge E1 at the bottom of the through-hole V3, and the upper surface 114t of the second organic layer 114 has a second edge E2. There is a second distance D2 between the first edge E1 and the second edge E2 of the second organic layer 114. In accordance with some embodiments, the first length L1 of the first organic layer 112 and the second distance D2 conform to the following formula: 0.2×the first length≤the second distance≤5×the first length. That is, the second distance D2 is greater than or equal to 0.2 times the first length L1 and less than or equal to 5 times the first length L1.

The aforementioned first length L1 may also be the length of the projection of the curved portion 112r of the first organic layer 112 on the substrate 102. Furthermore, the aforementioned second distance D2 refers to the distance between the first edge E1 and the second edge E2 of the second organic layer 114 in a direction perpendicular to the normal direction of the substrate 102 (for example, the X direction in the drawing). In addition, the first edge E1 and the second edge E2 are edges on the same side of the second organic layer 114.

It should be noted that when the first length L1 and the second distance D2 conform to the aforementioned formula: 0.2×the first length≤the second distance≤5×the first length, it can make the second organic layer 114 not affect the transmittance of the opening area even when the through-hole V3 is filled.

Furthermore, the flat portion 112p and the curved portion 112r of the first organic layer 112 have a junction XP1, and there is a third distance D3 between the junction XP1 and the second edge E2 of the second organic layer 114. In accordance with some embodiments, the third distance D3 conforms to the following formula: 0 μm≤the third distance≤10 μm. That is, the third distance D3 is greater than or equal to 0 μm and less than or equal to 10 μm. In accordance with some embodiments, the third distance D3 and the first length L1 of the first organic layer 112 conform to the following formula: the third distance≤0.5×the first length. That is, the third length D3 is less than or equal to 0.5 times the first length L1.

The aforementioned third distance D3 refers to the distance between the junction XP1 and the second edge E2 in a direction perpendicular to the normal direction of the substrate 102 (for example, the X direction in the drawing). In accordance with some embodiments, the junction XP1 of the flat portion 112p and the curved portion 112r can be defined as the intersection of an extension line of 0.9 times the maximum thickness t of the first organic layer 112 (in the normal direction of the substrate 102) and the upper surface 112t of the first organic layer 112. In other words, the portion of the upper surface 112t from the bottom of the through-hole V3 (e.g., the first edge E1) to 0.9*t is the curved portion 112r.

It should be noted that when the third distance D3 conforms to the aforementioned formula: 0 μm≤the third distance≤10 μm, it can make the second organic layer 114 not affect the transmittance of the opening area even when the through-hole is filled. Furthermore, when the third distance D3 and the first length L1 conform to the aforementioned formula: the third distance≤0.5×the first length, the second organic layer 114 can still have a leveling effect when the through-hole V3 is not filled.

Figures 4A, 4B:
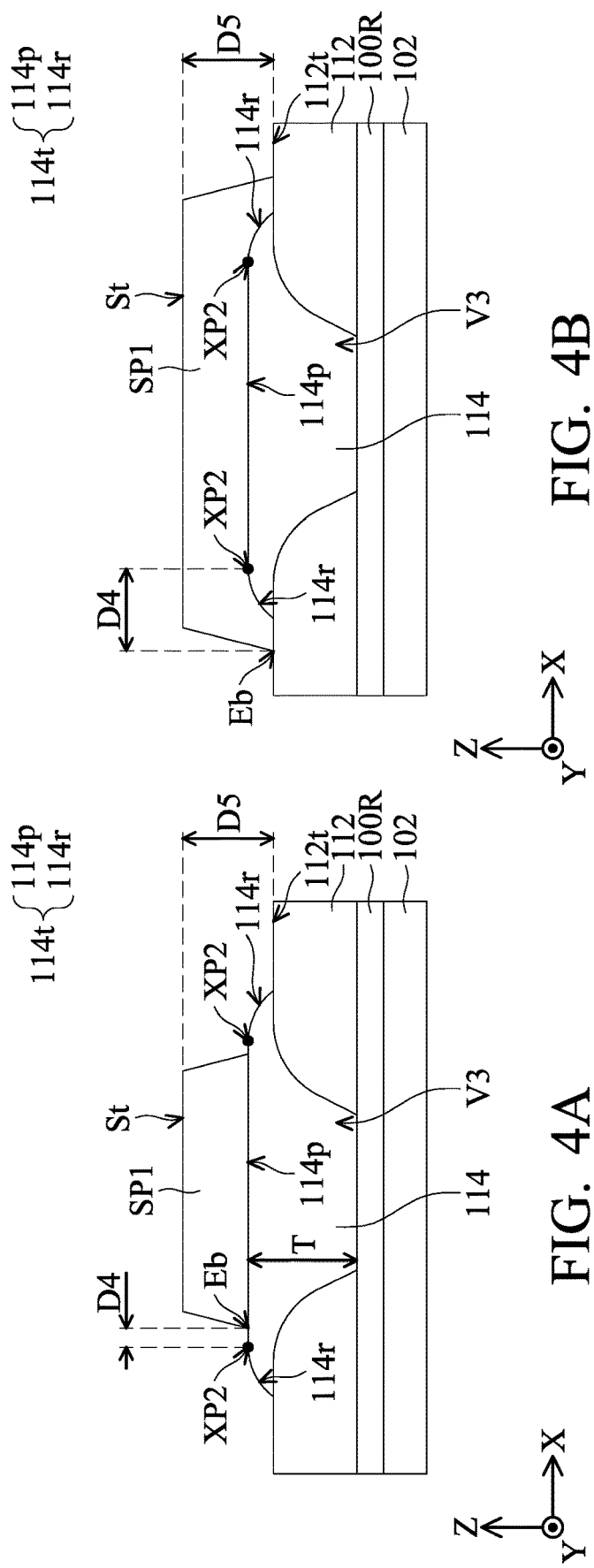
FIG. 4A and FIG. 4B are partial cross-sectional diagrams of an electronic device in accordance with some embodiments of the present disclosure.

Next, please refer to FIG. 4A and FIG. 4B, which are partial cross-sectional diagrams of the electronic device 10 (electronic device 20) in accordance with some other embodiments of the present disclosure. It should be understood that, for clarity, most components of the electronic device 10 (electronic device 20) are omitted in the drawings, and only the substrate 102, the structural layer 100R, the first organic layer 112, the second organic layer 114 and the first spacing element SP1 are shown.

As shown in FIG. 4A and FIG. 4B, in accordance with some embodiments, the first spacing element SP1 may be disposed on the second organic layer 114. In accordance with some embodiments, the first spacing element SP1 may extend on the flat portion 112p of the upper surface 112t of the first organic layer 112. Furthermore, the first spacing element SP1 may have a bottom edge Eb, and the bottom edge Eb may be located on the upper surface 114t of the second organic layer 114 (as shown in FIG. 4A), or on the upper surface 112t of the first organic layer 112 (as shown in FIG. 4B).

Moreover, the flat portion 114p and the curved portion 114r of the second organic layer 114 have a junction XP2, and there is a fourth distance D4 between the junction XP2 and the bottom edge Eb of the first spacing element SP1. In accordance with some embodiments, the fourth distance D4 conforms to the following formula: 0 µm≤the fourth distance≤5 µm. That is, the fourth distance D4 is greater than or equal to 0 µm and less than or equal to 5 µm.

The aforementioned fourth distance D4 refers to the distance between the junction XP2 and the bottom edge Eb in a direction perpendicular to the normal direction of the substrate 102 (for example, the X direction in the drawing). In some embodiments, the junction XP2 of the flat portion 114p and the curved portion 114r can be defined as the intersection of an extension line of 0.9 times the maximum thickness T of the second organic layer 114 (in the normal direction of the substrate 102) and the upper surface 114t of the second organic layer 114. In other words, the portion of the upper surface 114t from the upper surface 112t of the first organic layer 112 to 0.9*T is the curved portion 114r.

It should be noted that when the fourth distance D4 conforms to the aforementioned formula: 0 µm≤the fourth distance≤5 µm, the first spacing element SP1 can be stably disposed on the second organic layer 114 without affecting the transmittance of the opening area.

In addition, there is a fifth distance D5 between the upper surface St of the first spacing element SP1 and the upper surface 112t of the first organic layer 112. In accordance with some embodiments, the fifth distance D5 and the cell gap C1 of the electronic device conform to the following formula: 0.05×cell gap≤the fifth distance≤0.8×cell gap. That is, the fifth distance D5 is greater than or equal to 0.05 times the cell gap and less than or equal to 0.8 times the cell gap C1.

The aforementioned fifth distance D5 refers to the distance between the upper surface St of the first spacing element SP1 and the upper surface 112t of the first organic layer 112 (the flat portion 112p) in the normal direction of the substrate 102 (for example, the Z direction in the drawing).

It should be noted that when the fifth distance D5 conforms to the aforementioned formula: 0.05×cell gap≤the fifth distance≤0.8×gap, the first spacing element SP1 can provide support stably without affecting the display medium (for example, liquid crystal) arrangement.

In addition, in accordance with some embodiments, the electronic device may further include a second spacing element (not illustrated). The second spacing element may also be disposed on the second organic layer 114, and the height of the first spacing element SP1 may be different from the height of the second spacing element.

Next, please refer to FIG. 5A to FIG. 5D, which are partial cross-sectional diagrams of an electronic device during the intermediate stages of the manufacturing process in accordance with some embodiments of the present disclosure. It should be understood that, for clarity, most components of the electronic device are omitted in the drawings, and only the substrate 102, the structural layer 100R, the first organic layer 112 and the second organic layer 114 are shown. In addition, in accordance with some embodiments, additional operation steps may be provided before, during and/or after the manufacturing method of the electronic device. In accordance with some embodiments, some of the described operation steps may be replaced or deleted. In accordance with some embodiments, the order of the described operation steps may be interchangeable.

First, please also refer to FIG. 1. The manufacturing method of the electronic device may include providing a substrate 102. The manufacturing method may include forming a structural layer 100R (including a drain electrode 206b of a thin-film transistor TFT) on the substrate 102. The manufacturing method may include forming a first organic layer 112 on the drain electrode 206b, and forming a through-hole V3 in the first organic layer 112. The manufacturing method may include forming a transparent conductive layer 210 (the transparent conductive layer 210 is omitted in FIG. 5A to FIG. 5D) on the first organic layer 112. At least a portion of the transparent conductive layer 210 is filled into the through-hole V3. The manufacturing method may include forming the second organic layer 114 on the transparent conductive layer 210. The second organic layer 114 is filled into the through-hole V3. After the aforementioned steps, the electronic device substantially has the structure shown in FIG. 5A. In accordance with some embodiments, the electronic device may have an opening area OP and a non-opening area NP adjacent to the opening area OP. In accordance with some embodiments, the through-hole V3 may be located in the non-opening area NP. The "opening area" according to the present disclosure is, for example, a light-transmissive area in the display area (or active area), such as an area that allows backlight to penetrate, or, for example, an area of a sub-pixel that does not overlap with a light-shielding layer or a metal layer.

Next, a photolithography process may be performed on the second organic layer 114 to pattern the second organic layer 114. As shown in FIG. 5B, in accordance with some embodiments, a first exposure step may be performed on the first portion 114-1 of the second organic layer 114, and the first portion corresponds to the opening area OP of the electronic device. A first photomask 410 may be used in the first exposure step. In this embodiment, the first photomask 410 may have more than two kinds of light transmittance (the arrows in the drawing indicate the transmitted light). With the first photomask 410, the first exposure step can expose the second organic layer 114 corresponding to the opening area OP (the exposed area is marked with dots), while the second organic layer 114 corresponding to the non-opening area NP is not exposed. For example, the transmittance of the portion of the first photomask 410 corresponding to the opening area OP is greater than the transmittance of the portion of the first photomask 410 corresponding to the non-opening area NP, but the present disclosure is not limited thereto.

Next, as shown in FIG. 5C, in accordance with some embodiments, a second exposure step may be performed on the first portion 114-1 and the second portion 114-2 of the second organic layer 114, and the second portion 114-2 corresponds to the non-opening area NP of the electronic device. A second photomask 420 may be used in the second exposure step. That is, different photomasks are used in the first exposure step and the second exposure step. In this embodiment, the second exposure step can expose a portion of the second organic layer 114 corresponding to the non-opening area NP by using the second photomask 420 (the exposed area is marked with dots). For example, the portion of the second photomask 420 corresponding to the opening area OP and the portion corresponding to the non-opening area NP may have the same transmittance, and the transmittance of the second photomask 420 may be smaller than that of the first photomask 410 corresponding to the opening area OP, but the present disclosure is not limited thereto.

Next, as shown in FIG. 5D, a developing step may be performed to remove the exposed second organic layer 114.

After the developing step, the thickness of the second organic layer 114 corresponding to the non-opening area NP is reduced, and the second organic layer 114 corresponding to the opening area OP is removed. In this embodiment, the first photomask 410 may be used to pattern the second organic layer 114 first, and then the thickness of the second organic layer 114 may be adjusted through the second photomask 420.

It should be understood that, according to the embodiments of the present disclosure, the photolithography process performed on the second organic layer 114 is described as an example in which the second organic layer 114 is a positive photoresist material, but it is not limited thereto. The second organic layer 114 can also be a negative photoresist material, and the photolithography process can be adjusted accordingly.

Please refer to FIG. 6A to FIG. 6D, which are partial cross-sectional diagrams of an electronic device during the intermediate stages of the manufacturing process in accordance with some other embodiments of the present disclosure. FIG. 6A is the same as FIG. 5A, the electronic device may have an opening area OP and a non-opening area NP adjacent to the opening area OP, and the through-hole V3 may be located in the non-opening area NP.

Next, a photolithography process may be performed on the second organic layer 114 to pattern the second organic layer 114. As shown in FIG. 6B, in this embodiment, the second exposure step may be performed on a first portion 114-1 and a second portion 114-2 of the second organic layer 114 first, and the first portion 114-1 corresponds to the opening area OP of the electronic device and the second portion 114-2 corresponds to the non-opening area NP of the electronic device. A second photomask 420 may be used in the second exposure step. In this embodiment, by using the second photomask 420, the second exposure step can expose a portion of the second organic layer 114 corresponding to the opening area OP and the non-opening area NP (the exposed area is marked with dots).

Next, as shown in FIG. 6C, a first exposure step may be performed on the first portion 114-1 of the second organic layer 114, and the first portion 114-1 corresponds to the opening area OP of the electronic device. A first photomask 410 may be used in the first exposure step. In this embodiment, the first photomask 410 may have more than two kinds of light transmittance (the arrows in the drawing indicate the transmitted light). With the first photomask 410, the first exposure step can expose the second organic layer 114 corresponding to the opening area OP (the exposed area is marked with dots), while the second organic layer 114 corresponding to the non-opening area NP is not further exposed.

Next, as shown in FIG. 6D, a developing step may be performed to remove the exposed second organic layer 114. After the developing step, the thickness of the second organic layer 114 corresponding to the non-opening area NP is reduced, and the second organic layer 114 corresponding to the opening area OP is removed. In this embodiment, the second photomask 420 may be used to adjust the thickness of the second organic layer 114 first, and then the second organic layer 114 is patterned through the first photomask 410.

Please refer to FIG. 7A to FIG. 7C, which are partial cross-sectional diagrams of an electronic device during the intermediate stages of the manufacturing process in accordance with some other embodiments of the present disclosure. FIG. 7A is the same as FIG. 5A, the electronic device may have an opening area OP and a non-opening area NP adjacent to the opening area OP, and the through-hole V3 may be located in the non-opening area NP.

Next, a photolithography process may be performed on the second organic layer 114 to pattern the second organic layer 114. As shown in FIG. 7B, in this embodiment, the first exposure step may be performed on a first portion 114-1 and a second portion 114-2 of the second organic layer 114, and the first portion 114-1 corresponds to the opening area OP of the electronic device, and the second portion 114-2 corresponds to the non-opening area NP of the electronic device. A first photomask 410 may be used in the first exposure step. In this embodiment, the first photomask 410 may have more than two kinds of light transmittance (the arrows in the drawing indicate the transmitted light). For example, the first photomask 410 may be a half-tone mask or a gray tone mask. The light transmittance of the mask corresponding to the opening area OP may be 100%, while the light transmittance of the mask corresponding to the non-opening area NP may be less than 100% and greater than 0%. With the first photomask 410, the first exposure step can expose the second organic layer 114 corresponding to the opening area OP, and expose a portion of the second organic layer 114 corresponding to the non-opening area NP (the exposed area is marked with dots).

Next, as shown in FIG. 7C, a developing step may be performed to remove the exposed second organic layer 114. After the developing step, the thickness of the second organic layer 114 corresponding to the non-opening area NP is reduced, and the second organic layer 114 corresponding to the opening area OP is removed.

Please refer to FIG. 8A to FIG. 8E, which are partial cross-sectional diagrams of an electronic device during the intermediate stages of the manufacturing process in accordance with some other embodiments of the present disclosure. FIG. 8A is the same as FIG. 5A, the electronic device may have an opening area OP and a non-opening area NP adjacent to the opening area OP, and the through-hole V3 may be located in the non-opening area NP.

Next, a photolithography process may be performed on the second organic layer 114 to pattern the second organic layer 114. As shown in FIG. 8B, in this embodiment, the first exposure step may be performed on a first portion 114-1 and a second portion 114-2 of the second organic layer 114, and the first portion 114-1 corresponds to the opening area OP of the electronic device, and the second portion 114-2 corresponds to the non-opening area NP of the electronic device. The first photomask 410 may be used in the first exposure step. In this embodiment, the first photomask 410 may have more than two kinds of light transmittance (the arrows in the drawing indicate the transmitted light) (e.g., three kinds). For example, the first photomask 410 may be a halftone dot mask or a gray scale mask. The light transmittance of the photomask corresponding to the opening area OP may be 100%, and the light transmittance corresponding to the non-opening area NP may be less than 100% and greater than 0%. With the first photomask 410, the first exposure step can expose the second organic layer 114 corresponding to the opening area OP, and expose a portion of the second organic layer 114 corresponding to the non-opening area NP (the exposed area is marked with dots).

Next, as shown in FIG. 8C, a developing step may be performed to remove the exposed second organic layer 114. After the developing step, the thickness of the second organic layer 114 corresponding to the non-opening area NP is reduced, and the second organic layer 114 corresponding to the opening area OP is removed.

In addition, in this embodiment, the second organic layer 114 formed in FIG. 8B and FIG. 8C may correspond to the region of the second organic layer 114 where the first spacing element SP1 is disposed. Furthermore, the second organic layer 114 formed in FIG. 8D and FIG. 8E may correspond to the region of the second organic layer 114 where the second spacing element is disposed. In addition, the steps of FIG. 8D and FIG. 8E are also continued from FIG. 8A.

As shown in FIG. 8D, in this embodiment, the same first photomask 410 may be used to expose the region of the second organic layer 114 corresponding to the second spacing element. That is, the same photomask may be used in the first exposure step and the second exposure step. Specifically, the second organic layer 114 corresponding to the opening area OP may be exposed, and a portion of the second organic layer 114 corresponding to the non-opening area NP may be exposed (the exposed area is marked with dots). Moreover, since the first photomask 410 may have at least three kinds of light transmittance, the exposure amounts of the regions of the second organic layer 114 corresponding to the first spacing element SP1 and the second spacing element may be different.

Next, as shown in FIG. 8E, a developing step may be performed to remove the exposed second organic layer 114. After the developing step, the thickness of the second organic layer 114 corresponding to the non-opening area NP is reduced, and the second organic layer 114 corresponding to the opening area OP is removed. In addition, as shown in FIG. 8C and FIG. 8E, after the developing step, the thickness of the second organic layer 114 corresponding to the first spacing element SP1 and the second spacing element may be different. For example, the thickness of the second organic layer 114 corresponding to the first spacing element SP1 may be greater than the thickness of the second organic layer 114 corresponding to the second spacing element.

Please refer to FIG. 9A to FIG. 9F, which are partial cross-sectional diagrams of an electronic device during the intermediate stages of the manufacturing process in accordance with some other embodiments of the present disclosure. FIG. 9A is the same as FIG. 5A, the electronic device may have an opening area OP and a non-opening area NP adjacent to the opening area OP, and the through-hole V3 may be located in the non-opening area NP.

Next, a photolithography process may be performed on the second organic layer 114 to pattern the second organic layer 114. As shown in FIG. 9B, in this embodiment, the first exposure step may be performed on a first portion 114-1 of the second organic layer 114, and the first portion 114-1 corresponds to the opening area OP of the electronic device. The first photomask 410 may be used in the first exposure step. In this embodiment, the first photomask 410 may have more than two kinds of light transmittance (the arrows in the drawing indicate the transmitted light). With the first photomask 410, the first exposure step can expose the second organic layer 114 corresponding to the opening area OP (the exposed area is marked with dots), while the second organic layer 114 corresponding to the non-opening area NP is not exposed.

Next, as shown in FIG. 9C, the second exposure step may be performed on the first portion 114-1 and the second portion 114-2 of the second organic layer 114, and the second portion 114-2 corresponds to the non-opening area NP of the electronic device. The second photomask 420 may be used in the second exposure step. In this embodiment, the second photomask 420 may have more than two kinds of light transmittance (the arrows in the drawing indicate the transmitted light). With the second photomask 420, the second exposure step can expose a portion of the second organic layer 114 corresponding to the non-opening area NP (the exposed area is marked with dots).

Next, as shown in FIG. 9C, a developing step may be performed to remove the exposed second organic layer 114. After the developing step, the thickness of the second organic layer 114 corresponding to the non-opening area NP is reduced, and the second organic layer 114 corresponding to the opening area OP is removed.

In addition, in this embodiment, the second organic layer 114 formed in FIG. 9C and FIG. 9D may correspond to the region of the second organic layer 114 where the first spacing element SP1 is disposed. Furthermore, the second organic layer 114 formed in FIG. 9E and FIG. 9F may correspond to the region of the second organic layer 114 where the second spacing element is disposed. In addition, the steps of FIG. 9E and FIG. 9F are also continued from FIG. 9B.

As shown in FIG. 9E, in this embodiment, the same second photomask 420 may be used to expose the region of the second organic layer 114 corresponding to the second spacing element. Specifically, a portion of the second organic layer 114 corresponding to the non-opening area NP may be exposed (the exposed area is marked with dots). Moreover, since the second photomask 420 may have at least three kinds of light transmittance, the exposure amounts of the regions of the second organic layer 114 corresponding to the first spacing element SP1 and the second spacing element may be different.

Next, as shown in FIG. 9F, a developing step may be performed to remove the exposed second organic layer 114. After the developing step, the thickness of the second organic layer 114 corresponding to the non-opening area NP is reduced, and the second organic layer 114 corresponding to the opening area OP is removed. In addition, as shown in FIG. 9D and FIG. 9F, after the developing step, the thickness of the second organic layer 114 corresponding to the first spacing element SP1 and the second spacing element may be different. For example, the thickness of the second organic layer 114 corresponding to the first spacing element SP1 may be greater than the thickness of the second organic layer 114 corresponding to the second spacing element.

Figures 10A, 10B, 10C, 10D, 10E, 10F:
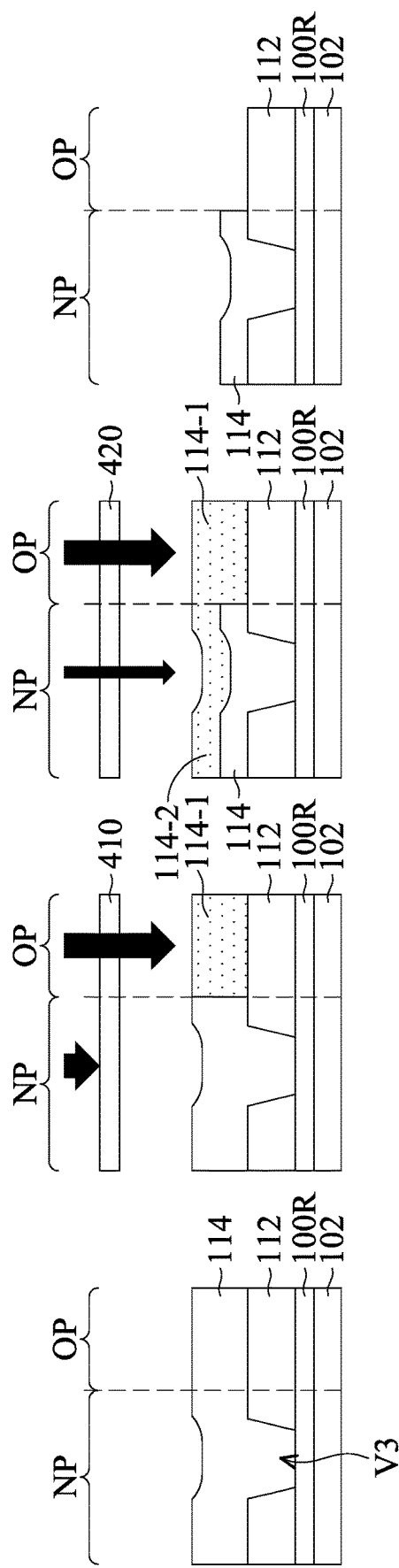
FIG. 10A to FIG. 10F are partial cross-sectional diagrams of an electronic device during the intermediate stages of the manufacturing process in accordance with some embodiments of the present disclosure.

Please refer to FIG. 10A to FIG. 10F, which are partial cross-sectional diagrams of an electronic device during the intermediate stages of the manufacturing process in accordance with some other embodiments of the present disclosure. FIG. 10A is the same as FIG. 5A, the electronic device may have an opening area OP and a non-opening area NP adjacent to the opening area OP, and the through-hole V3 may be located in the non-opening area NP.

Next, a photolithography process may be performed on the second organic layer 114 to pattern the second organic layer 114. As shown in FIG. 10B, in this embodiment, the first exposure step may be performed on a first portion 114-1 of the second organic layer 114, and the first portion 114-1 corresponds to the opening area OP of the electronic device. The first photomask 410 may be used in the first exposure step. In this embodiment, the first photomask 410 may have more than two kinds of light transmittance (the arrows in the drawing indicate the transmitted light). With the first photomask 410, the first exposure step can expose the second organic layer 114 corresponding to the opening area OP (the exposed area is marked with dots), while the second organic layer 114 corresponding to the non-opening area NP is not exposed.

Next, as shown in FIG. 10C, a second exposure step may be performed on the first portion 114-1 and the second portion 114-2 of the second organic layer 114, and the second portion 114-2 corresponds to the non-opening area NP of the electronic device. The second photomask 420 may be used in the second exposure step. Moreover, in this embodiment, the second photomask 420 may have more than two kinds of light transmittance (the arrows in the drawing indicate the transmitted light). With the second photomask 420, the second exposure step may expose a portion of the second organic layer 114 corresponding to the non-opening area NP (the exposed area is marked with dots).

Next, as shown in FIG. 10D, a developing step may be performed to remove the exposed second organic layer 114. After the developing step, the thickness of the second organic layer 114 corresponding to the non-opening area NP is reduced, and the second organic layer 114 corresponding to the opening area OP is removed.

In addition, in this embodiment, the second organic layer 114 formed in FIG. 10C and FIG. 10D may correspond to the region of the second organic layer 114 where the first spacing element SP1 is disposed. Furthermore, the second organic layer 114 formed in FIG. 10E and FIG. 10F may correspond to the region of the second organic layer 114 where the second spacing element is disposed. In addition, the steps of FIG. 10E and FIG. 10F are also continued from FIG. 10B.

As shown in FIG. 10E, in this embodiment, a third photomask 430 may be used to expose the region of the second organic layer 114 corresponding to the second spacing element. The third photomask 430 may have more than two kinds of light transmittance (the arrows in the drawing indicate the transmitted light). Specifically, a portion of the second organic layer 114 corresponding to the non-opening area NP may be exposed (the exposed area is marked with dots). Furthermore, the regions of the second photomask 420 and the third photomask 430 corresponding to the non-opening area NP may have different kinds of light transmittance. Therefore, the exposure amounts of the second organic layer 114 corresponding to the first spacing element SP1 and the second spacing element may be different.

Next, as shown in FIG. 10F, a developing step may be performed to remove the exposed second organic layer 114. After the developing step, the thickness of the second organic layer 114 corresponding to the non-opening area NP is reduced, and the second organic layer 114 corresponding to the opening area OP is removed. In addition, as shown in FIG. 10D and FIG. 10F, after the developing step, the thickness of the second organic layer 114 corresponding to the first spacing element SP1 and the second spacing element may be different. For example, the thickness of the second organic layer 114 corresponding to the first spacing element SP1 may be greater than the thickness of the second organic layer 114 corresponding to the second spacing element.

Please refer to FIG. 11A to FIG. 11F, which are partial cross-sectional diagrams of an electronic device during the intermediate stages of the manufacturing process in accordance with some other embodiments of the present disclosure. As shown in FIG. 11A, in this embodiment, the electronic device may further include a bonding area BP, and the bonding area BP may be adjacent to the non-opening area NP, the through-hole V3 may be located in the non-opening area NP, and a through-hole V' may be located in the bonding area BP. Furthermore, the second organic layer 114 may also be disposed in the through-hole V'.

Next, a photolithography process may be performed on the second organic layer 114 to pattern the second organic layer 114. As shown in FIG. 11B, in this embodiment, the first exposure step may be performed on a third portion 114-3 of the second organic layer 114, and the third portion 114-3 corresponds to the bonding area BP of the electronic device (e.g. peripheral area). In addition, although the opening area OP is not shown in the drawings, the first organic layer corresponding to the opening area OP may also be exposed simultaneously in the first exposure step. The first photomask 410 may be used in the first exposure step. In this embodiment, the first photomask 410 may have more than two kinds of light transmittance (the arrows in the drawing indicate the transmitted light. With the first photomask 410, the first exposure step can expose the second organic layer 114 corresponding to the bonding area BP (the exposed region is marked with dots), while the second organic layer 114 corresponding to the non-opening area NP is not exposed.

Then, as shown in FIG. 11C, a developing step may be performed to remove the exposed second organic layer 114. After the developing step, the second organic layer 114 corresponding to the bonding area BP is removed.

In addition, in this embodiment, the second organic layer 114 formed in FIG. 11B and FIG. 11C may correspond to the region of the second organic layer 114 where the first spacing element SP1 is disposed. Furthermore, the second organic layer 114 formed in FIGS. 11D to 11F may correspond to the region of the second organic layer 114 where the second spacing element is disposed. In addition, the steps of FIGS. 11D to 11F are also continued from FIG. 11C.

As shown in FIG. 11D, in this embodiment, the second photomask 420 may be used to expose the region of the second organic layer 114 corresponding to the second spacing element. The second photomask 420 may have two more than two kinds of light transmittance (the arrows in the drawing indicate the transmitted light). Specifically, a portion of the second organic layer 114 corresponding to the non-opening area NP may be exposed (the exposed area is marked with dots).

Next, as shown in FIG. 11E, a developing step may be performed to remove the exposed second organic layer 114. After the developing step, the thickness of the second organic layer 114 corresponding to the non-opening area NP is reduced. In accordance with some embodiments, as shown in FIG. 11F, after the developing step, the thickness of the second organic layer 114 corresponding to the non-opening area NP can be thinned to be substantially aligned with the first organic layer 112. Furthermore, as shown in FIGS. 11E to 11F, after the developing step, the thicknesses of the second organic layer 114 corresponding to the first spacing element SP1 and the second spacing element may be different. For example, the thickness of the second organic layer 114 corresponding to the first spacing element SP1 may be greater than the thickness of the second organic layer 114 corresponding to the second spacing element.

Please refer to FIG. 12A to FIG. 12G, which are partial cross-sectional diagrams of an electronic device during the intermediate stages of the manufacturing process in accordance with some other embodiments of the present disclosure. As shown in FIG. 12A, in this embodiment, the electronic device may further include a bonding area BP, and the bonding area BP may be adjacent to the non-opening area NP, the through-hole V3 may be located in the non-opening area NP, and a through-hole V' may be located in the bonding area BP. Furthermore, the second organic layer 114 may also be disposed in the through-hole V'.

Next, a photolithography process may be performed on the second organic layer 114 to pattern the second organic layer 114. As shown in FIG. 12B, in this embodiment, the first exposure step may be performed on a third portion 114-3 of the second organic layer 114, and the third portion 114-3 corresponds to the bonding area BP of the electronic device. In addition, although the opening area OP is not shown in the drawings, the first organic layer corresponding to the opening area OP may also be exposed simultaneously in the first exposure step. The first photomask 410 may be used in the first exposure step. In this embodiment, the first photomask 410 may have more than two kinds of light transmittance (the arrows in the drawing indicate the transmitted light). With the first photomask 410, the first exposure step may expose a portion of the second organic layer 114 corresponding to the bonding area BP (the exposed region is marked with dots), while the second organic layer 114 corresponding to the non-opening area NP is not exposed.

Next, as shown in FIG. 12C, the second exposure step may be continued on the third portion 114-3 of the second organic layer 114. The second photomask 420 may be used in the second exposure step. In addition, in this embodiment, the second photomask 420 may have more than two kinds of light transmittance (the arrows in the drawing indicate the transmitted light). With the second photomask 420, the second exposure step may expose the second organic layer 114 corresponding to the bonding area BP (the exposed region is marked with dots), while the second organic layer 114 corresponding to the non-opening area NP is not exposed.

Next, as shown in FIG. 12D, a developing step may be performed to remove the exposed second organic layer 114. After the developing step, the second organic layer 114 corresponding to the bonding area BP is removed.

In addition, in this embodiment, the second organic layer 114 formed in FIGS. 12B to 12D may correspond to the region of the second organic layer 114 where the first spacing element SP1 is disposed. Furthermore, the second organic layer 114 formed in FIGS. 12E to 12G may correspond to the region of the second organic layer 114 where the second spacing element is disposed. In addition, the steps of FIGS. 12E to 12G are also continued from FIG. 12A.

As shown in FIG. 12E, in this embodiment, the first photomask 410 may also be used to expose the area of the second organic layer 114 corresponding to the second spacing element. In addition, the portion of the first photomask 410 that is used to expose the area corresponding to the second organic layer 114 where the second spacing element is disposed may be a blank photomask. Specifically, the second organic layer 114 corresponding to the non-opening area NP and the bonding area BP may be exposed (the exposed area is marked with dots).

Next, as shown in FIG. 12F, the second photomask 420 may also be used to expose the area corresponding to the second organic layer 114 where the second spacing element is disposed. Specifically, the second organic layer 114 corresponding to the bonding area BP can be exposed (the exposed region is marked with dots), while the second organic layer 114 corresponding to the non-opening area NP is not exposed.

Next, as shown in FIG. 12G, a developing step may be performed to remove the exposed second organic layer 114. After the developing step, the thickness of the second organic layer 114 corresponding to the non-opening area NP is reduced, and the second organic layer 114 corresponding to the bonding area BP is removed. In accordance with some embodiments, as shown in FIG. 12G, after the developing step, the thickness of the second organic layer 114 corresponding to the non-opening area NP can be thinned to be substantially aligned with the first organic layer 112. In addition, as shown in FIG. 12D and FIG. 12G, after the developing step, the thickness of the second organic layer 114 corresponding to the first spacing element SP1 and the second spacing element may be different. For example, the thickness of the second organic layer 114 corresponding to the first spacing element SP1 may be greater than the thickness of the second organic layer 114 corresponding to the second spacing element.

To summarize the above, in accordance with the embodiments of the present disclosure, the electronic device includes a first organic layer having a through-hole disposed between the drain electrode and the transparent conductive layer, and a second organic layer disposed in the through-hole. The first organic layer and the second organic layer are configured in a specific manner, thereby improving the performance of the electronic device without affecting the pixel aperture ratio, for example, improving the display quality such as contrast or transmittance. In addition, in accordance with the embodiments of the present disclosure, a method of manufacturing an electronic device is also provided, which can improve the process yield and enhance the reliability of the electronic device.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of the present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
    a substrate;
    a thin-film transistor disposed on the substrate and including a drain electrode;
    a transparent conductive layer disposed on the drain electrode and electrically connected to the drain electrode;
    a first organic layer disposed between the drain electrode and the transparent conductive layer, and the first organic layer having a through-hole; and a second organic layer disposed in the through-hole, wherein the electronic device has a cell gap, there is a first distance between an upper surface of the first organic layer and an upper surface of the second organic layer, and the cell gap and the first distance conform to the following formula:

0<the first distance≤0.8×the cell gap.

2. The electronic device as claimed in claim 1, wherein the upper surface of the first organic layer has a flat portion and a curved portion adjacent to the flat portion, the curved portion is adjacent to the through-hole, and the curved portion has a first length in a horizontal direction.

3. The electronic device as claimed in claim 2, wherein the second organic layer has a first edge at a bottom of the through-hole, and the upper surface of the second organic layer has a second edge.

4. The electronic device as claimed in claim 3, wherein there is a second distance between the first edge and the second edge, and the first length and the second distance conform to the following formula:

0.2×the first length≤the second distance≤5×the first length.

5. The electronic device as claimed in claim 3, wherein there is a third distance between a junction of the flat portion and the curved portion of the first organic layer and the second edge, and the third distance conforms to the following formula:

0 μm≤the third distance≤10 μm.

6. The electronic device as claimed in claim 5, wherein the third distance and the first length conform to the following formula:

the third distance≤0.5×the first length.

7. The electronic device as claimed in claim 1, further comprising a first spacing element disposed on the second organic layer.

8. The electronic device as claimed in claim 7, wherein the upper surface of the second organic layer has a flat portion and a curved portion adjacent to the flat portion, the first spacing element has a bottom edge, and there is a fourth distance between a junction of the flat portion and the curved portion of the second organic layer and the bottom edge, and the fourth distance conforms to the following formula:

0 μm≤the fourth distance≤5 μm.

9. The electronic device as claimed in claim 7, wherein there is a fifth distance between an upper surface of the first spacing element and the upper surface of the first organic layer, and the fifth distance and the cell gap conform to the following formula:

0.05×the cell gap≤the fifth distance≤0.8×the cell gap.

10. The electronic device as claimed in claim 7, further comprising a second spacing element disposed on the second organic layer, and a height of the first spacing element is different from a height of the second spacing element.

11. A method of manufacturing an electronic device, comprising:
providing a substrate;
forming a thin-film transistor on the substrate, wherein the thin-film transistor includes a drain electrode;
forming a first organic layer on the drain electrode, and forming a through-hole in the first organic layer;
forming a transparent conductive layer on the first organic layer, wherein at least a portion of the transparent conductive layer is filled into the through-hole, wherein the transparent conductive layer is electrically connected to the drain electrode; and
forming a second organic layer on the transparent conductive layer, and the second organic layer is filled into the through-hole,
wherein the electronic device has a cell gap, there is a first distance between an upper surface of the first organic layer and an upper surface of the second organic layer, and the cell gap and the first distance conform to the following formula:

0<the first distance≤0.8×the cell gap.

12. The method of manufacturing an electronic device as claimed in claim 11, further comprising performing a photolithography process on the second organic layer to pattern the second organic layer.

13. The method of manufacturing an electronic device as claimed in claim 12, wherein the photolithography process further comprises:
performing a first exposure step on a first portion of the second organic layer, wherein the first portion corresponds to an opening area of the electronic device;
performing a second exposure step on the first portion and a second portion of the second organic layer, wherein the second portion corresponds to a non-opening area of the electronic device; and
performing a developing step to remove the exposed second organic layer.

14. The method of manufacturing an electronic device as claimed in claim 13, wherein different photomasks are used in the first exposure step and the second exposure step.

15. The method of manufacturing an electronic device as claimed in claim 13, wherein the same photomask is used in the first exposure step and the second exposure step.

16. The method of manufacturing an electronic device as claimed in claim 15, wherein the photomasks used in the first exposing step and the second exposing step have more than two kinds of light transmittance.

17. The method of manufacturing an electronic device as claimed in claim 13, wherein the first exposure step is performed before the second exposure step.

18. The method of manufacturing an electronic device as claimed in claim 13, wherein the first exposure step is performed after the second exposure step.

19. The method of manufacturing an electronic device as claimed in claim 12, wherein the photolithography process further comprises:
performing a first exposure step on a first portion and a second portion of the second organic layer, wherein the first portion corresponds to an opening area of the electronic device, and the second portion corresponds to an non-opening area of the electronic device; and
performing a developing step to remove the exposed second organic layer, wherein the photomask used in the first exposing step has more than two kinds of light transmittance.

20. The method of manufacturing an electronic device as claimed in claim 12, wherein the photolithography process further comprises:
performing a first exposure step on a first portion of the second organic layer, wherein the first portion corresponds to a bonding area of the electronic device;
performing a second exposure step on a second portion of the second organic layer, wherein the second portion corresponds to a non-opening area of the electronic device; and performing a developing step to remove the exposed second organic layer.

* * * * *